(12) United States Patent
Wanunu et al.

(10) Patent No.: US 11,073,764 B2
(45) Date of Patent: Jul. 27, 2021

(54) NANOSCALE ETCHING OF LIGHT ABSORBING MATERIALS USING LIGHT AND AN ELECTRON DONOR SOLVENT

(71) Applicant: Northeastern University, Boston, MA (US)

(72) Inventors: Meni Wanunu, Needham, MA (US); Hirohito Yamazaki, Brighton, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 16/368,616

(22) Filed: Mar. 28, 2019

(65) Prior Publication Data

US 2019/0302619 A1    Oct. 3, 2019

Related U.S. Application Data

(60) Provisional application No. 62/650,023, filed on Mar. 29, 2018.

(51) Int. Cl.
*G03F 7/20* (2006.01)
*C04B 41/53* (2006.01)
(Continued)

(52) U.S. Cl.
CPC ........ *G03F 7/2043* (2013.01); *C04B 41/5353* (2013.01); *G01N 21/59* (2013.01);
(Continued)

(58) Field of Classification Search
CPC ........ G03F 7/2053; G03F 7/2043; G03F 7/11; C04B 41/5353; G01N 21/59; H01L 21/67075
(Continued)

(56) References Cited

U.S. PATENT DOCUMENTS

2003/0169618 A1 * 9/2003 Lindsey ................. B82Y 10/00
                                                             365/151
2009/0214622 A1 * 8/2009 Poinern ................. C25D 11/08
                                                             424/443
(Continued)

FOREIGN PATENT DOCUMENTS

GB          1337626 A       11/1973

OTHER PUBLICATIONS

Pud et al. ("Self-Aligned Plasmonic Nanopores by Optically Controlled Dielectric Breakdown", Nano Letters 2015, pp. 7112-7116). (Year: 2018).*

(Continued)

*Primary Examiner* — Binh X Tran
(74) *Attorney, Agent, or Firm* — Hamilton, Brook, Smith & Reynolds, P.C.

(57) ABSTRACT

A method for etching a light absorbing material permits directly writing a pattern of etching of silicon nitride and other light absorbing materials, without the need of a lithographic mask, and allows the creation of etched features of less than one micron in size. The method can be used for etching deposited silicon nitride films, freestanding silicon nitride membranes, and other light absorbing materials, with control over the thickness achieved by optical feedback. The etching is promoted by solvents including electron donor species, such as chloride ions. The method provides the ability to etch silicon nitride and other light absorbing materials, with fine spatial and etch rate control, in mild conditions, including in a biocompatible environment. The method can be used to create nanopores and nanopore arrays.

24 Claims, 20 Drawing Sheets

(51) Int. Cl.
G01N 21/59 (2006.01)
G03F 7/11 (2006.01)
G03F 7/004 (2006.01)
(52) U.S. Cl.
CPC ............ G03F 7/0041 (2013.01); G03F 7/11 (2013.01); G03F 7/2053 (2013.01)
(58) Field of Classification Search
USPC ............................................ 216/56, 87, 99
See application file for complete search history.

(56) References Cited

U.S. PATENT DOCUMENTS

2011/0263129 A1    10/2011  Shin et al.
2017/0363741 A1*   12/2017  Send .................... H04N 9/0451
2018/0043310 A1*    2/2018  Bustamante ......... B01D 67/006

OTHER PUBLICATIONS

Ying et al. ("3D Nanopore Shape Control by Current-Stimulus Dielectric Breakdown", Applied Physics Letter 109, 063105. (Year: 2016).*
Pud et al: "Self-Aligned Plasmonic Nanopores by Optically Controlled Dielectric Breakdown", Nano Letters, vol. 15, No. 10, Oct. 14, 2015 (Oct. 14, 2015), pp. 7112-7117.
Hofmeister et al: "Patterned polymer matrix promotes stemness and cell-cell interaction of adult stem cells", Journal of Biological Engineering, Biomed Central Ltd, vol. 9, article 18, Oct. 12, 2015 (Oct. 12, 2015), pp. 1-9.
International Search Report and Written Opinion for PCT/US2019/024674, "Nanoscale Etching of Light Absorbing Materials using Light and an Electron Donor Solvent", dated Jul. 3, 2019.
Yamazaki, et al., "Photothermally Assisted Thinning of Silicon Nitride Membranes for Ultrathin Asymmetric Nanopores", ACS Nano, 2018, 12, pp. 12472-12481.
Gilboa et al., "A. Optically-Monitored Nanopore Fabrication Using a Focused Laser Beam", Sci. Rep. 2018, 8, 9765.
Deshpande et al. "Optical Properties of Silicon Nitride Films Deposited by Hot Filament Chemical Vapor Deposition," J. Appl. Phys. 1995, 77, 6534-6541.
Giorgis et al, "Optical Absorption and Photoluminescence Properties of a-Si1-xNx: H Films Deposited by Plasma-enhanced CVD," Phys. Rev. B: Condens. Matter Mater. Phys. 2000, 61, 4693-4698.
Yamazaki et al., "Label-Free Single-Molecule Thermoscopy Using a Laser-Heated Nanopore," Nano Lett. 2017, 17, 7067-7074.
Nicoli et al., "DNA Translocations through Solid-State Plasmonic Nanopores," Nano Lett. 2014, 14, 6917-6925.
Keyser et al., "Nanopore Tomography of a Laser Focus," Nano Lett. 2005, 5, 2253-2256.
Pant et al., "Etching of Silicon Nitride in CCl2F2, CHF3, SiF4, and SF6 Reactive Plasma: A Comparative Study," Plasma Chem. Plasma Process. 1999, 19, 545-563.
Staffa et al., "Temperature Dependence of the Etch Rate and Selectivity of Silicon Nitride over Silicon Dioxide in Remote Plasma NF3/Cl2," Appl. Phys. Lett. 1995, 67, 1902-1904.
Fournier et al., "The Solubility of Amorphous Silica at High Temperatures and High Pressures," Am. Mineral. 1977, 62, 1052-1056.
Reineke et al., "Shift of pH-Value During Thermal Treatments in Buffer Solutions and Selected Foods," Int. J. Food Prop. 2011, 14, 870-881.
Rothemund et al, "Dielectric Breakdown of Reactively Sputtered Silicon Nitride," Thin Solid Films 1973, 15, 199-205.
Lombardo et al, "Dielectric Breakdown Mechanisms in Gate Oxides," J. Appl. Phys. 2005, 98, 121301.
McPherson et al., "Underlying Physics of the Thermochemical E Model in Describing Low-field Time-dependent Dielectric Breakdown in SiO2 Thin Films," J. Appl. Phys. 1998, 84, 1513-1523.
Wanunu et al., "Rapid Electronic Detection of Probe-specific microRNAs using Thin Nanopore Sensors," Nat. Nanotechnol. 2010, 5, 807.
Kowalczyk et al, "Modeling the Conductance and DNA Blockade of Solid-state Nanopores," Nanotechnology 2011, 22, 315101.
Henrickson et al, "Driven DNA Transport into an Asymmetric Nanometer-Scale Pore," Phys. Rev. Lett. 2000, 85, 3057-3060.
Bell et al., "Asymmetric Dynamics of DNA Entering and Exiting a Strongly Confining Nanopore," Nat. Commun. 2017, 8, 380.
Fologea et al., "DNA Conformation and Base Number Simultaneously Determined in a Nanopore," Electrophoresis 2007, 28, 3186-3192.
Carson et al., "Smooth DNA Transport through a Narrowed Pore Geometry," Biophys. J. 2014, 107, 2381-2393.
Lin et al., "Characterization of DNA Dduplex Unzipping through a Sub-2 nm Solid-state Nanopore," Chem. Commun. 2017, 53, 3539-3542.
Akeson et al., "Microsecond Time-Scale Discrimination Among Polycytidylic Acid, Polyadenylic Acid, and Polyuridylic Acid as Homopolymers or as Segments Within Single RNA Molecules," Biophys. J. 1999, 77, 3227-3233.
Derrington et al., "Nanopore DNA Sequencing with MspA," Proc. Natl. Acad. Sci. U.S.A. 2010, 107, 16060-16065.
Meller et al, "Rapid Nonopore Discrimination between Single Polynucleotide Molecules," Proc. Natl. Acad. Sci. U.S.A. 2000, 97, 1079-1084.
Venta et al., "Differentiation of Short, Single-Stranded DNA Homopolymers in Solid-State Nanopores," ACS Nano 2013, 7, 4629-4636.
Akahori et al., "Discrimination of Three Types of Homopolymers in Singlestranded DNA with Solid-state Nanopores through External Control of the DNA Motion," Sci. Rep. 2017, 7, 9073.
Lee et al., "A Low-Noise Solid-State Nanopore Platform Based on a Highly Insulating Substrate," Sci. Rep. 2015, 4, 7448.
Ying et al., "Formation of Single Nanopores with Diameters of 20-50 nm in Silicon Nitride Membranes Using Laser-Assisted Controlled Breakdown," ACS Nano, 2019, vol. 12, pp. 11458-11470.
International Preliminary Search Report and Written Opinion for International Application No. PCT/US2019/024674 entitled "Nanoscale Etching of Light Absorbing Materials using Light and an Electron Donor Solvent" consisting of 7 pages. Dated Sep. 29, 2020.

* cited by examiner

NANOSCALE ETCHING OF LIGHT ABSORBING MATERIALS USING LIGHT AND AN ELECTRON DONOR SOLVENT

RELATED APPLICATION

This application claims the benefit of U.S. Provisional Application No. 62/650,023, filed on Mar. 29, 2018. The entire teachings of the above application are incorporated herein by reference.

BACKGROUND

Silicon nitride is a widely used material as a component of solid-state devices for applications in biotechnology, electronics, photonics, and other areas. Processing silicon nitride films in order to provide defined topographical features is a major part of the silicon industry, and has been for the past few decades a routine practice for micro- and nanostructure fabrication. Lithography in silicon nitride typically requires aggressive dry or wet chemical treatment, which can be accomplished using a photolithography or electron beam mask layer followed by chemical processing.

There is, however, an ongoing need to provide improved methods of etching silicon nitride and other light absorbing materials, so that the rate of etching and the spatial extent of the etching can be more finely controlled, and so that the etching can be performed with less expense and in milder conditions.

In addition, there is an ongoing need for methods to shape materials at the nanoscale. These have received much attention in recent years, largely due to the need for technologies that allow the investigation of quantum phenomena at the nanoscale, but also as vehicles for interfacing with the molecular/biomolecular world. Nanopore sensors are prime examples of nanoscale devices that sense small molecules, biomolecules, and their complexes. Sensing in nanopores is most frequently performed by applying a voltage across a nanopore that contains two electrolyte baths across it and measuring as a function of time the flux of ions that cross the pore. When an analyte (e.g., DNA, protein, or a small molecule) occupies the pore, the ion flux temporarily changes, affording indirect electrical detection of biomolecules in a label-free manner.

An attractive form of nanopores for future integration into sensing devices is a silicon chip that contains a freestanding membrane composed of silicon nitride ($SiN_x$) or another material, through which a hole is fabricated using one of various methods. Nanopore sensors are not "one-size-fits-all"; their dimension requirements are typically commensurate with the analyte size. Therefore, the nanopore physical properties, which include its diameter, length, shape, and interfacial properties, typically need tailoring for optimal sensing.

A variety of approaches have been developed for nanopore fabrication, but there is an ongoing need for techniques that confer high resolution for biopolymer analysis, for example, for creating high-resolution pores that are comparable in geometry to protein-based nanopores used in DNA sequencing.

SUMMARY

In accordance with an embodiment of the invention, a method for etching a light absorbing material permits directly writing a pattern of etching of silicon nitride and other light absorbing materials, without the need of a lithographic mask, and allows the creation of etched features of less than one micron in size. The method can, for example, be used for etching deposited silicon nitride films, freestanding silicon nitride membranes, and other light absorbing materials, with control over the thickness achieved by optical feedback. The etching is promoted by solvents including electron donor species, such as chloride ions. The method provides the ability to etch silicon nitride and other light absorbing materials, with fine spatial and etch rate control, in mild conditions, including in a biocompatible environment. The method can be used to create nanopores and nanopore arrays.

In accordance with one embodiment, there is provided a method for etching a light absorbing material. The method comprises contacting the light absorbing material with a solvent comprising an electron donor species, and exposing an interface between the solvent and the light absorbing material to light having a wavelength within an absorption band of a light absorbance spectrum of the light absorbing material to induce etching of the light absorbing material, at the interface, by the light and the electron donor species to create an etched feature of less than 1 micron in size.

In further, related embodiments, the light absorbing material may comprise silicon; and may comprise at least one of a silicon-containing nitride and a silicon-containing carbide. The light absorbing material may comprise a chemical formula $SiN_x$, where x is greater than or equal to 0 and less than or equal to 2. The electron donor species may comprise at least one of a halogen ion and a hydroxide ion; and may comprise a chloride ion. The method may comprise exposing the interface between the solvent and the light absorbing material to the light in the absence of a lithographic mask. The etching may comprise forming a nanopore through the light absorbing material, the nanopore having a diameter greater than about 1 nanometer and less than about 1 micron. The light absorbing material may comprise a thickness less than about 1 micron at the location of the nanopore.

In other, related embodiments, forming the nanopore may comprise limiting a power density of the light after a current measured through the light absorbing material rapidly increases above a current threshold during the etching. The method may comprise limiting the current threshold to determine a size of the nanopore formed by the etching. The etched feature may define a nanopore having a greater diameter on one side of the light absorbing material than on an opposite side of the light absorbing material. The method may further comprise using the etching to form an array of a plurality of nanopores. The method may further comprise assisting the etching by applying a voltage across the light absorbing material to promote dielectric breakdown of the light absorbing material. The etched feature may be formed underneath a surface of a structure of which the light absorbing material forms at least a portion.

In further, related embodiments, the method may comprise controlling a thickness of the etched feature using feedback from an optical measurement of the etched feature. The solvent may be biocompatible, and the etching may be performed in a biocompatible environment. The light may have a wavelength between about 10 nm and about 400 nm; and may have a wavelength between about 400 nm and about 700 nm. The light may have an average power density of greater than about $10^5$ watts per square centimeter, such as between about $10^5$ watts per square centimeter and about $10^8$ watts per square centimeter.

In other, related embodiments, the method may further comprise performing a three-dimensional, layer by layer etching of the light absorbing material. The method may comprise using a light image projection device to provide the light, to perform the three-dimensional, layer by layer etching, based on an electrical signal comprising a three-dimensional etching pattern having features with dimensions less than 1 micron in size. The etching may be used to polish a surface of the light absorbing material. The method may comprise reflecting a beam of the light from a spatial light modulator onto the light absorbing material. Reflecting the beam of the light from the spatial light modulator onto the light absorbing material may comprise reflecting the beam of the light from a digital micromirror device onto the light absorbing material. The method may comprise directly controlling a location of the etched feature on the light absorbing material based on a location of the light on the light absorbing material.

In another embodiment, there is provided an apparatus comprising a light absorbing material, the apparatus comprising an etched feature comprising a nanopore through the light absorbing material, the nanopore having a diameter greater than about 1 nanometer and less than about 1 micron; wherein the nanopore has a greater diameter on one side of the light absorbing material than on an opposite side of the light absorbing material.

In further, related embodiments, the light absorbing material may comprise a thickness less than about 1 micron at the location of the nanopore. The apparatus may comprise an array of a plurality of nanopores.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 9A is a continuous current trace of a $SiN_x$ and $HfO_2$-coated $SiN_x$ pore at $T_{pore}$=60° C. for 10 min (V=100 mV) under 532 nm laser irradiation (laser turned on after 5 s), in an experiment in accordance with an embodiment of the invention.

FIG. 9B is a TEM image of 75 nm-thick $SiN_x$ membrane after 47 mW laser illumination for 10 min in water, 0.4 M sodium acetate, and 0.4 M KCl (T=300° C.), in an experiment in accordance with an embodiment of the invention.

FIG. 9C is a TEM image of a 75 nm-thick $SiN_x$ membrane after 1.5 mW laser illumination for 8 h in 4 M KCl, in an experiment in accordance with an embodiment of the invention.

FIG. 12A shows a continuous current trace obtained during $SiN_x$ laser assisted dielectric breakdown (35 mW laser power, V=1 V, laser turned on at 0 s), in an experiment in accordance with an embodiment of the invention.

FIG. 12B is a scatter plot of pore thicknesses vs breakdown times for 29 pores with three different laser powers used (P=47 mW shown in red, P=35 mW shown in blue, and P=24 mW shown in green), in an experiment in accordance with an embodiment of the invention.

FIG. 13A shows continuous 1 s trace excerpts at 200, 250, and 300 mV for a 2.7 nm pore with 1.7 nm effective thickness for a mixture of 250 bp (30 nM) and 2.5 kbp (3 nM) dsDNA added to the cis chamber, in an experiment in accordance with an embodiment of the invention.

FIG. 13B shows $\Delta I/I0$ vs log $t_d$ of a mixture of 250 bp and 2.5 kbp at 200, 250, and 300 mV, showing an optimal resolution between the two lengths at 300 mV, in an experiment in accordance with an embodiment of the invention.

FIG. 14A is a schematic diagram of sequentially unzipping dsDNA to expose a predetermined temporal sequence of homopolymers to the pore, in an experiment in accordance with an embodiment of the invention.

FIG. 14B is a current trace of DNA unzipping in a 1.4 nm diameter pore with 1.8 nm effective thickness at 200 mV (trace was low-pass-filtered at 1 kHz), in an experiment in accordance with an embodiment of the invention.

FIG. 14C shows I levels of poly(dC) (blue markers) and poly(dA) (red markers) and ΔI dA-dC (black squares), in an experiment in accordance with an embodiment of the invention.

FIG. 14D is a histogram of differential ΔI dA-dC with the Gaussian fit, in an experiment in accordance with an embodiment of the invention.

DETAILED DESCRIPTION

A description of example embodiments follows.

In accordance with an embodiment of the invention, a method for etching a light absorbing material permits directly writing a pattern of etching of silicon nitride and other light absorbing materials, without the need of a lithographic mask, and allows the creation of etched features of less than one micron in size. The method can, for example, be used for etching deposited silicon nitride films, freestanding silicon nitride membranes, and other light absorbing materials, with control over the thickness achieved by optical feedback. The etching is promoted by solvents including electron donor species, such as chloride ions. The method provides the ability to etch silicon nitride and other light absorbing materials, with fine spatial and etch rate control, in mild conditions, including in a biocompatible environment. The method can be used to create nanopores and nanopore arrays.

Sculpting solid-state materials at the nanoscale is an important step in the manufacturing of numerous types of sensor devices, such as solid-state nanopore sensors. An embodiment according to the invention provides laser-induced thinning of low-stress silicon nitride ($SiN_x$) membranes and films, and other light absorbing materials. The light absorbing material, such as $SiN_x$, can be etched under exposure to light of an average intensity on the order of $10^7$ W/cm$^2$, or other intensities taught herein, with etch rates that are influenced by the supporting electrolyte. Combining this controlled etching with dielectric breakdown, an electrokinetic process for making pores, including nanopores of arbitrary dimensions as small as 1-2 nm in diameter and thickness, is provided. Refined control over pore dimensions can expand the range of applications of solid-state nanopores, for example, for biopolymer sequencing and detection of specific biomarkers.

Figure 1:
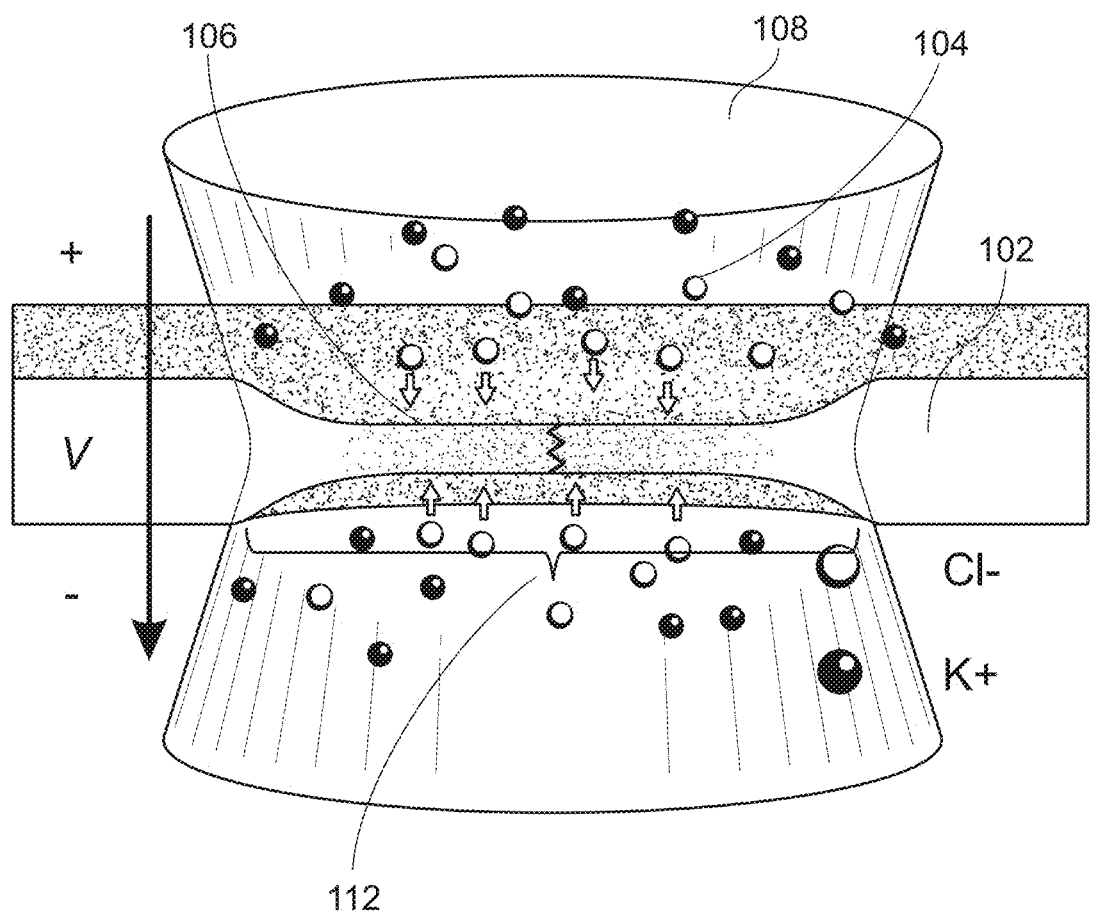
FIG. 1 is a schematic diagram illustrating a method for etching a light absorbing material, in accordance with an embodiment of the invention.

FIG. 1 is a schematic diagram illustrating a method for etching a light absorbing material, in accordance with an embodiment of the invention. The method includes contacting a light absorbing material 102, such as silicon nitride ($SiN_x$), with a solvent comprising an electron donor species 104, such as chloride ions. The interface 106 between the solvent and the light absorbing material is exposed to light 108 having a wavelength within an absorption band 210*a/b* (see FIG. 2) of a light absorbance spectrum of the light absorbing material 102. The light 108 and the electron donor species 104 together induce etching of the light absorbing material 102, at the interface 106, to create an etched feature 112 of less than 1 micron in size.

Figure 2:
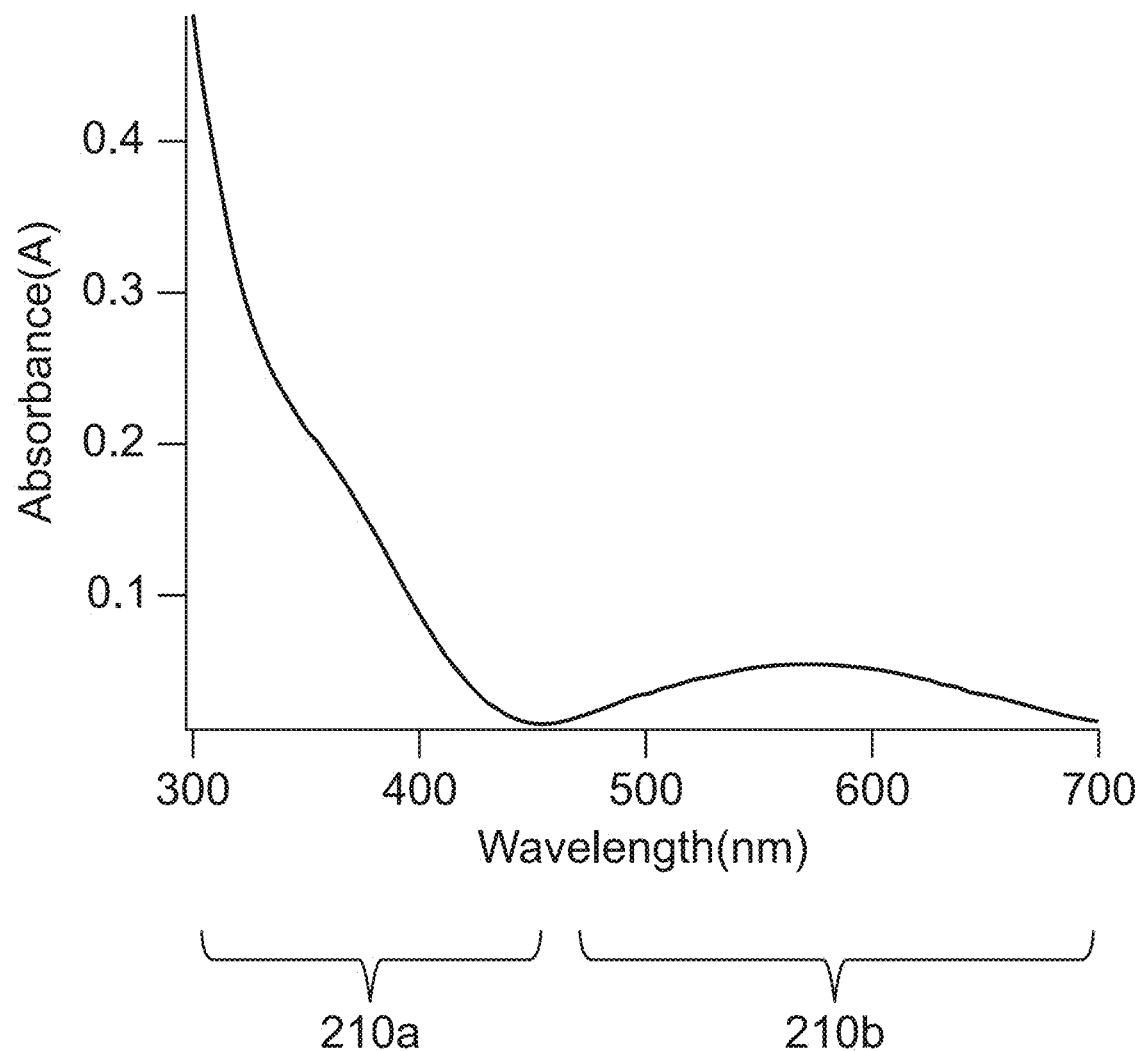
FIG. 2 is a graph illustrating a light absorbance spectrum of a light absorbing material, which can be etched by a method in accordance with an embodiment of the invention.

FIG. 2 is a graph illustrating a light absorbance spectrum of a light absorbing material, which can be etched by a method in accordance with an embodiment of the invention. In this example, the light absorbing material is silicon nitride ($SiN_x$), and two light absorption bands 210*a/b* are shown; one, 210*a*, in the ultraviolet portion of the light absorbance spectrum, and one, 210*b*, in the visible portion of the light absorbance spectrum. As used herein, a "light absorption band" is a range of wavelengths in the light absorbance spectrum of a light absorbing material that absorbs light at a non-zero absorbance that is sufficient to promote etching of the light absorbing material by methods taught herein.

In accordance with embodiments of the invention, the light used can, for example, have an ultraviolet wavelength, such as between about 10 nm and about 400 nm, and can have a visible wavelength, such as between about 400 nm and about 700 nm. The light can have an average power density of greater than about $10^5$ watts per square centimeter, such as between about $10^5$ watts per square centimeter and about $10^8$ watts per square centimeter, or such as on the order of $10^7$ watts per square centimeter.

Figure 3:
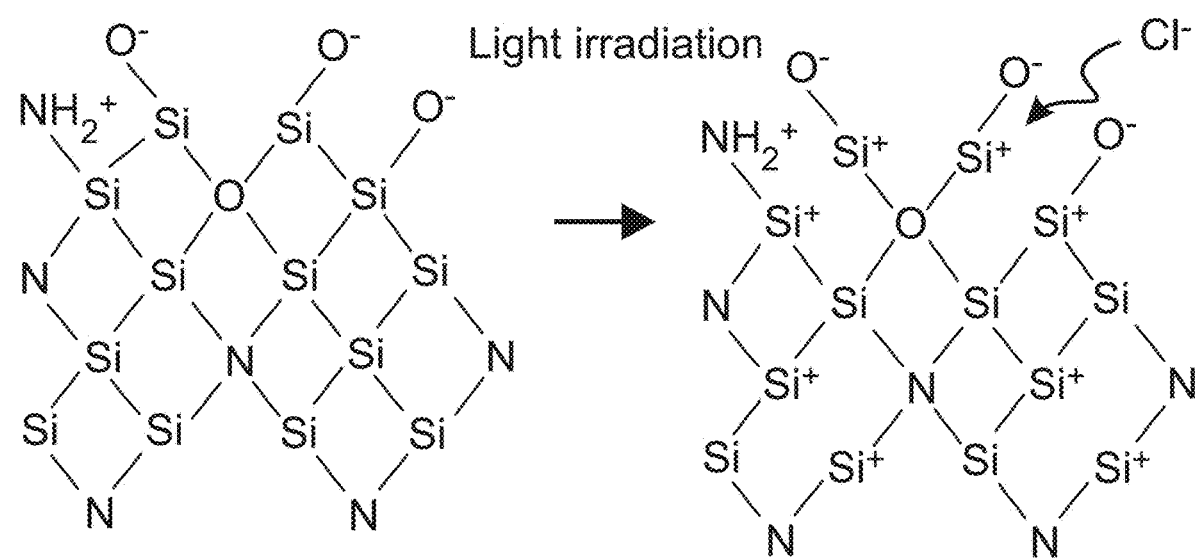
FIG. 3 is a schematic diagram illustrating a proposed mechanism of etching of $SiN_x$, assisted by chloride ions, in accordance with an embodiment of the invention.

FIG. 3 is a schematic diagram illustrating a proposed mechanism of etching of $SiN_x$, assisted by chloride ions, in accordance with an embodiment of the invention. Without wishing to be bound by any specific theory, it is proposed that, when Si-rich regions of $SiN_x$ absorb the laser irradiation, the electron-poor photoactivated Si can attract chloride ion (Cl$^-$) binding, thereby promoting Si—Si bond breaks, which lead to eventual oxidation. The resulting amorphous oxide is soluble at high temperatures, leading to thinning of the $SiN_x$ membrane. It will be appreciated that an analogous mechanism may be present when other light absorbing materials and electron donor species are used.

In accordance with embodiments of the invention, the "light absorbing material" can include any material that absorbs light in any of a wide variety of regions of the electromagnetic spectrum, including ultraviolet wavelengths, such as between about 10 nm and about 400 nm, and visible wavelengths, such as between about 400 nm and about 700 nm. The light absorbing material can, for example, comprise silicon; and can comprise at least one of a silicon-containing nitride and a silicon-containing carbide. The light absorbing material can, for example, comprise a chemical formula $SiN_x$, where x is greater than or equal to 0 and less than or equal to 2.

In accordance with embodiments of the invention, the "electron donor species" is a chemical entity that donates electrons to another compound. For example, the electron donor species can be at least one of a halogen ion and a hydroxide ion. In one example, the electron donor species can comprise a chloride ion.

In accordance with embodiments of the invention, the solvent can be any suitable solvent that includes the electron donor species that is used in the method of etching. For example, a solution of potassium chloride (KCl) can be used to deliver chloride ions as the electron donor species. It will be appreciated that a wide variety of solvents, including halogen-containing solvents such as sodium fluoride, sodium chloride, sodium bromide, sodium iodide, potassium fluoride, potassium chloride, potassium bromide, potassium iodide, can be used. Basic solvents can be used to deliver hydroxide ions as the electron donor species, such as, for example, potassium hydroxide (KOH), sodium hydroxide (NaOH), and other basic solvents. In some embodiments, pure water can be used to deliver the hydroxide ions. Other solvents containing electron donor species can be used, such as dimethyl sulfoxide (DMSO) and dimethylformamide (DMF). The solvent can be biocompatible, and the etching can be performed in a biocompatible environment. As used herein, "biocompatible" is the quality of not having toxic or injurious effects on biological systems.

Figure 4:
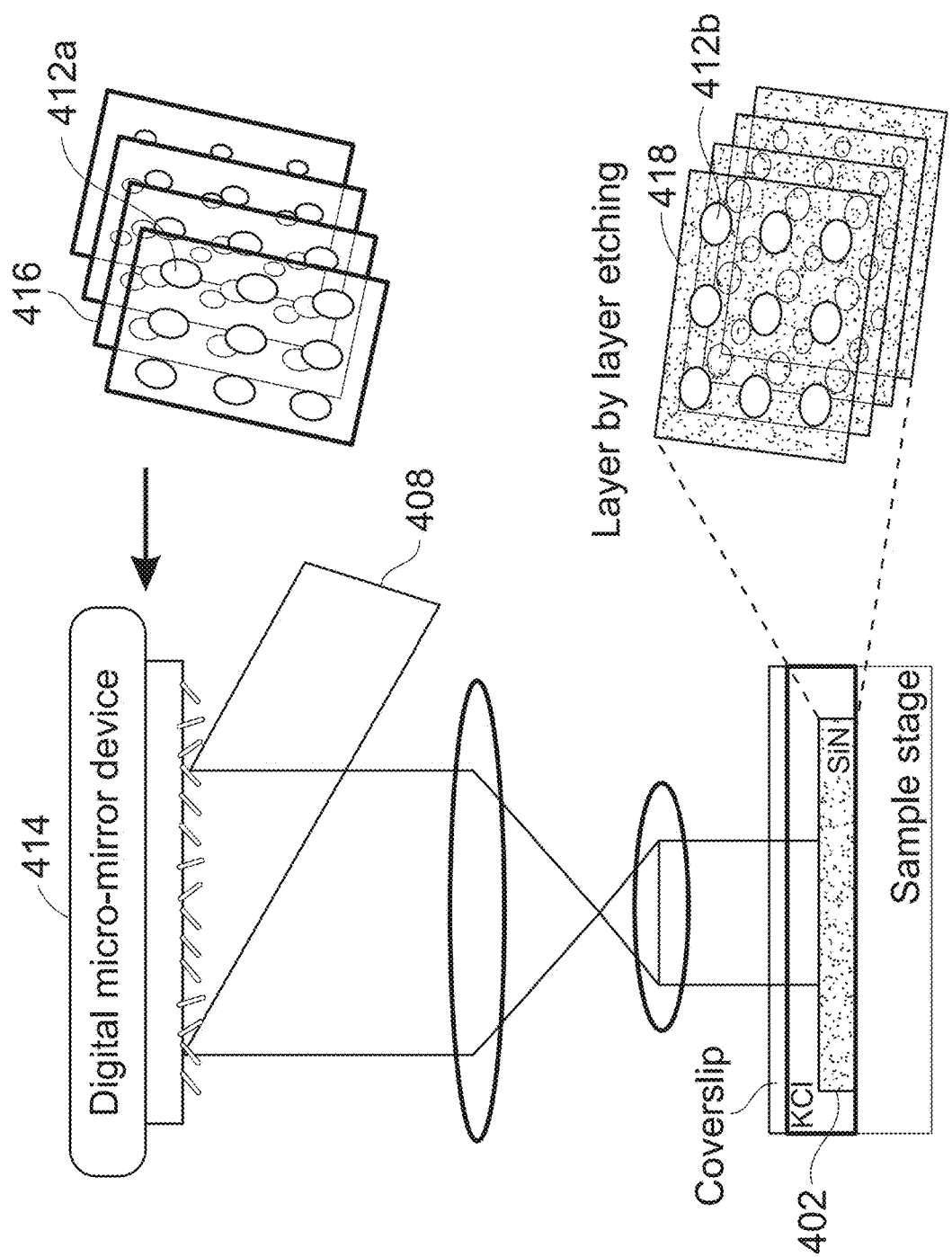
FIG. 4 is a schematic diagram illustrating a method for three-dimensional etching, in accordance with an embodiment of the invention.

FIG. 4 is a schematic diagram illustrating a method for three-dimensional etching, in accordance with an embodiment of the invention. In FIG. 4, parallel surface photoetching is performed using a broad light source that reflects from a digital micromirror device (DMD) 414, or any other spatial light modulator (SLM). This method can be used for three-dimensional micro-nanofabrication. More generally, methods in accordance with an embodiment of the invention can include exposing the interface between the solvent and the light absorbing material to the light, in the absence of a lithographic mask. For example, in FIG. 4, no lithographic mask is between the digital micromirror device 414 and the light absorbing material 402, which in this example is silicon nitride (SiN). In the embodiment of FIG. 4, the method includes performing a three-dimensional, layer by layer etching of the light absorbing material. A light image projection device (not shown) is used to provide the light 408, to perform the three-dimensional, layer by layer etching 418, based on an electrical signal 416 comprising a three-dimensional etching pattern having features 412a with dimensions less than 1 micron in size. The beam of light 408 can be reflected from the spatial light modulator, such as the digital micromirror device 414, onto the light absorbing material 402. This technique can be used to perform single step micro-nano fabrication. Fabrication of an elaborate micro-nanostructure on a surface, such as a $SiN_x$ surface, would require a time-consuming serial scanning of the beam. However, using laser image projection such as a digital micro-mirror device 414, the design of the etching pattern 416 allows one to fabricate a 3D scaffold in a layer-by-layer manner at a wafer scale. A location of the etched feature 412b on the light absorbing material can be directly controlled, based on the location of the light 408 on the light absorbing material 402.

In another embodiment, the etched feature can be formed underneath a surface of a structure of which the light absorbing material forms at least a portion. For example, the light 408 can be transmitted through a surface of a structure (in the position of coverslip 452 of FIG. 4, for example, but attached to light absorbing material 402), of which the light absorbing material 402 forms a part. The etching can then proceed underneath the surface of the structure, on the light absorbing material 402.

Figure 5:
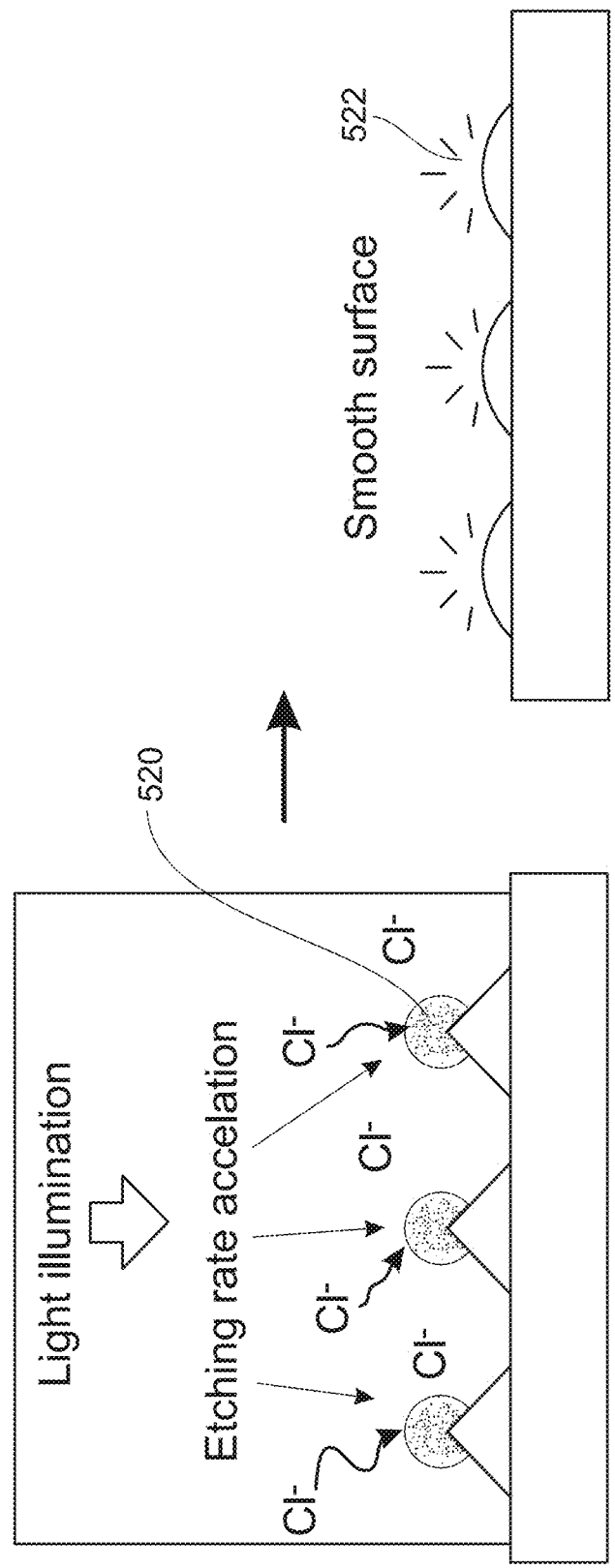
FIG. 5 is a schematic diagram illustrating use of a method of etching in accordance with an embodiment of the invention to polish a surface of a light absorbing material.

FIG. 5 is a schematic diagram illustrating use of a method of etching in accordance with an embodiment of the invention to polish a surface of a light absorbing material, such as to polish a rough surface of a silicon material. Since light illumination on a rough surface creates a strong localized light spot 520 on a sharp-edged surface, this condition accelerates the etching speed on the sharp-edged surfaces as compared with the surrounding smooth surfaces, leading to a polished surface 522.

Figure 6:
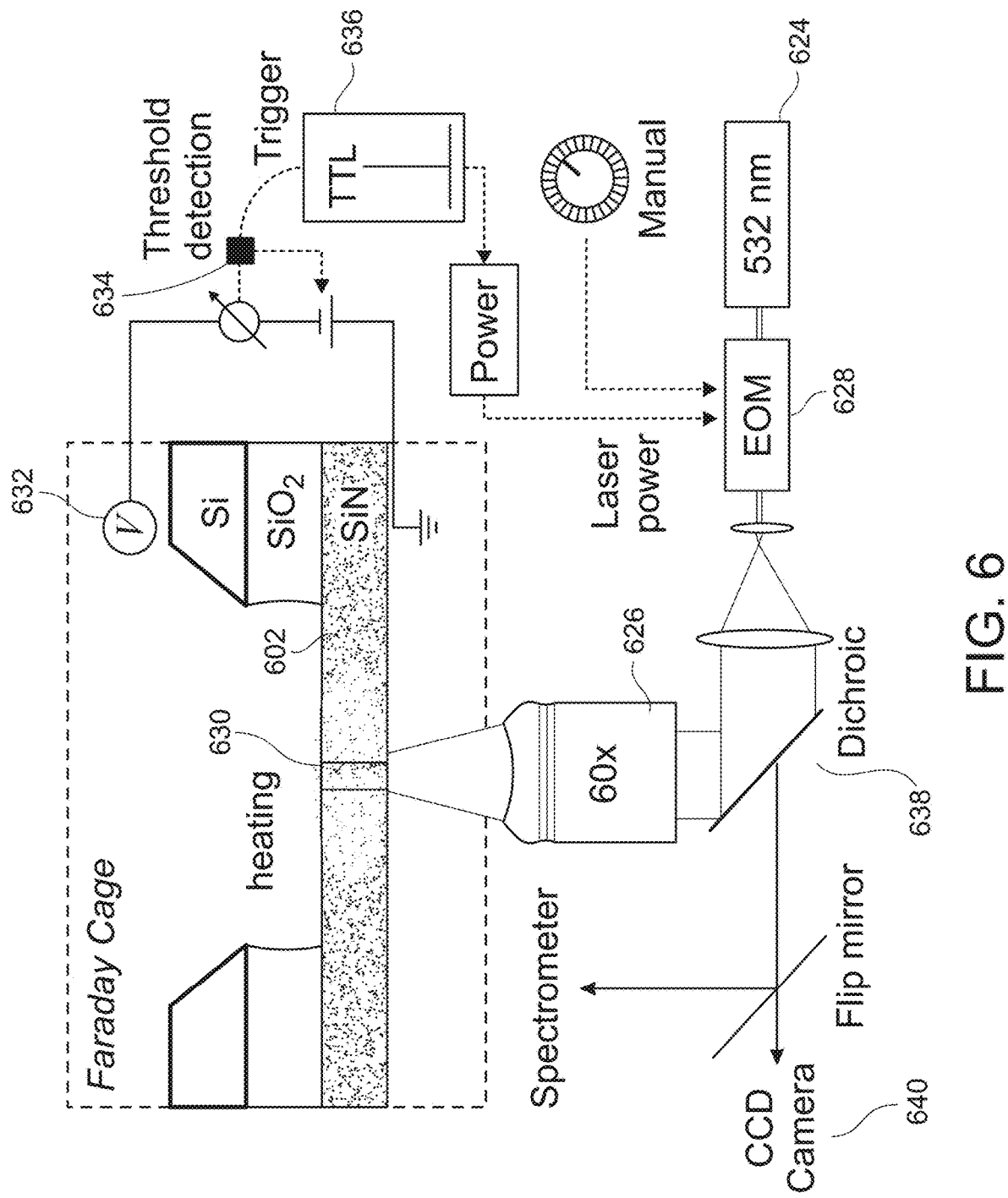
FIG. 6 is a schematic diagram illustrating components used to control formation of a nanopore, in accordance with an embodiment of the invention.

In accordance with an embodiment of the invention, the method of etching can include forming a nanopore through the light absorbing material. For example, the nanopore can have a diameter greater than about 1 nanometer and less than about 1 micron; and the light absorbing material can have a thickness less than about 1 micron at the location of the nanopore. In addition, the method can include using the etching to form an array of a plurality of nanopores in the light absorbing material. FIG. 6 is a schematic diagram illustrating components that can be used to control formation of a nanopore, in accordance with an embodiment of the invention. In this example, a light source 624, such as a collimated 532 nm laser, is focused on a $SiN_x$ membrane, or other light absorbing material 602, using an objective lens, such as a 60x inverted objective lens, 626. The $SiN_x$ membrane 602 is mounted between two fluidic chambers (here, the top referred to as -cis, the bottom as -trans). (Here, it is noted that the solvent containing the electron donor species, which is in the fluid chambers on either side of the light absorbing material 602, is not shown in FIG. 6). The laser power is electrically controlled using an electro-optical modulator 628. The current across the nanopore 630 is monitored by applying a bias voltage 632 between Ag/AgCl electrodes (the voltage is applied to the -cis chamber in this scheme). Forming the nanopore can include limiting a power density of the light after a current measured through the light absorbing material rapidly increases above a current threshold during the etching. For this purpose, a threshold detection circuit 634 can be used, so that when a measured current across the nanopore 630 exceeds the threshold current setpoint of the threshold detection circuit 634, a trigger circuit 636 provides an electrical signal to limit or shut off the power of the laser, for example by controlling the electro optical modulator 628. The method can include limiting the current threshold to determine the size of the nanopore 630 formed by the etching; for example, a larger threshold current can be used to create a larger nanopore, and a smaller threshold current can be used to create a smaller nanopore. In addition, the method can include controlling a thickness of the etched feature using feedback from an optical measurement of the etched feature. In one example, reflected light from the light source 624, transmitted lamp light, and fluorescence from the nanopore 630 (or other etched feature) can be passed through a dichroic mirror 638, and be detected by a light detection device 640 such as a CCD camera or spectrometer. Using feedback of the detected fluorescence, in one example, the thickness of the etched feature can be controlled by limiting or shutting off the etching when the desired thickness is reached.

Figure 7:
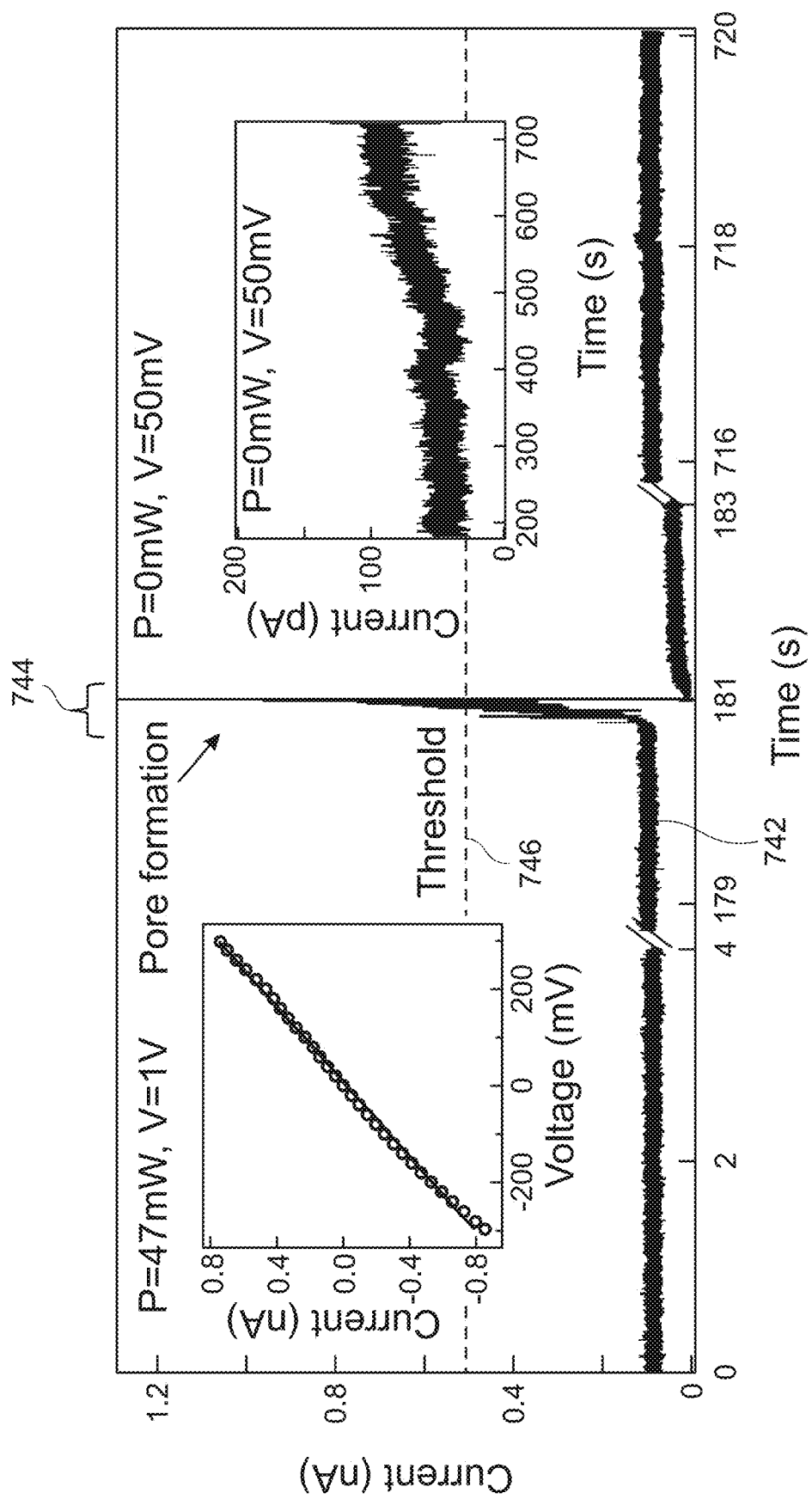
FIG. 7 is a graph illustrating measurements during a method of limiting the power density of the light after a current measured through the light absorbing material rapidly increases above a current threshold during the etching, in accordance with an embodiment of the invention.

FIG. 7 is a graph illustrating measurements during a method of limiting the power density of the light after a current measured through the light absorbing material rapidly increases above a current threshold during the etching, in accordance with an embodiment of the invention. For example, an apparatus such as that of FIG. 6 can be used to implement such a method. In FIG. 7, the measured current 742 rapidly increases over a short time frame 744 (for example, less than about 0.5 seconds), to a level above the threshold current 746. This rapid increase is taken as signifying the formation of the nanopore (or other feature) in the light absorbing material. After the current increases above the current threshold in this fashion during the etching, the power density of the light is then limited, as discussed above in connection with FIG. 6.

In another embodiment, the method can include assisting the etching by applying a voltage across the light absorbing material to promote dielectric breakdown of the light absorbing material. For example, a bias voltage 632 (see FIG. 6) can be set a sufficiently high level (for example, higher than 100 mV, 200 mV or 300 mV), and be used while applying the light source to the light absorbing material, in the presence of the solvent containing the electron donor species, to promote dielectric breakdown of the light absorbing material in order to assist the etching.

Figure 8:
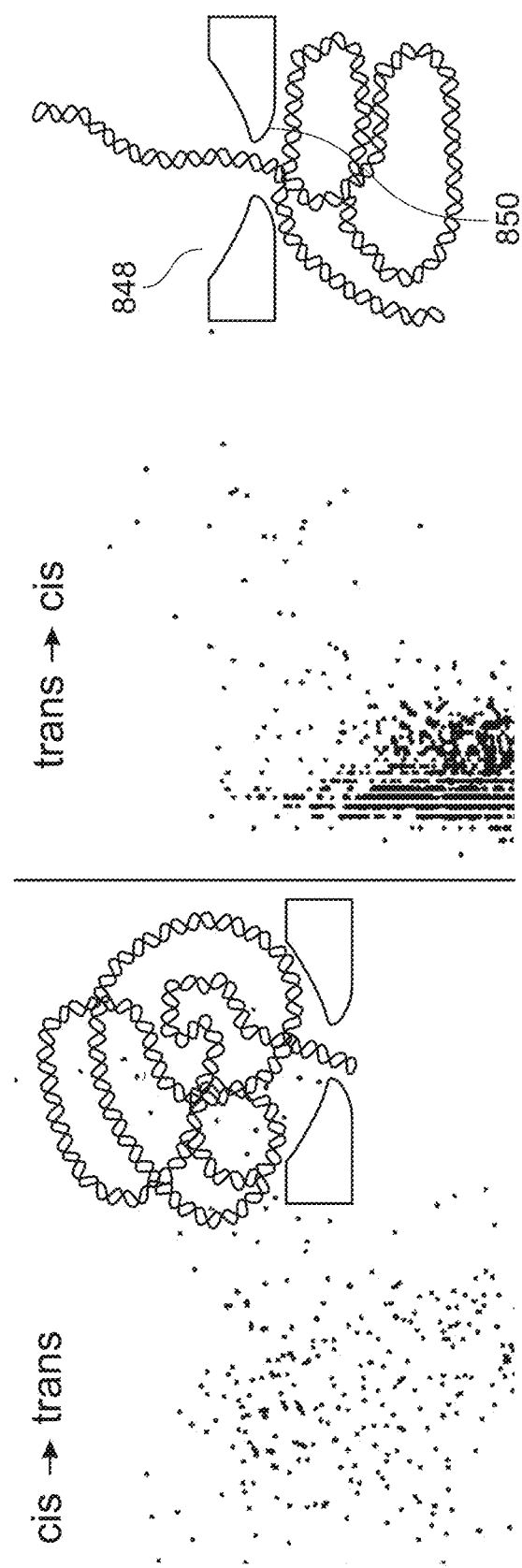
FIG. 8 is a schematic diagram of a nanopore, having a greater diameter on a -cis side of a nanopore, as compared with a -trans side, formed in accordance with an embodiment of the invention.

In another embodiment, the etched feature can define a nanopore having a greater diameter on one side of the light absorbing material than on an opposite side of the light absorbing material. FIG. 8 is a schematic diagram of a nanopore having a greater diameter on a -cis side 848 of the nanopore, as compared with a -trans side 850, formed in accordance with an embodiment of the invention. The size of the nanopore can be demonstrated using translocation of DNA through the nanopore from the -cis to the -trans side and vice versa, as described further in experiments, herein.

Further embodiments of the invention are apparatuses that include a nanopore formed by any of the techniques taught herein, including an array of such nanopores.

Experimental: Overview

Experiments in accordance with an embodiment of the invention have found that $SiN_x$ can be etched under exposure to light of ~$10^7$ W/cm$^2$ average intensity, with etch rates that are influenced by the supporting electrolyte. Combining this controlled etching with dielectric breakdown, an electrokinetic process for making pores, nanopores of arbitrary dimensions as small as 1-2 nm in diameter and thickness can easily be fabricated. Evidence gathered from biomolecule-pore interactions suggests that the pore geometries obtained using this method are more funnel-like, rather than hourglass-shaped. Refined control over pore dimensions can expand the range of applications of solid-state nanopores, for example, biopolymer sequencing and detection of specific biomarkers.

Experiments in accordance with an embodiment of the invention have investigated the factors that lead to light induced etching of $SiN_x$, focusing on photoexcitation, heating, and chemical catalysis as the driving factors. High temperatures have been shown to be obtained at the pore under laser irradiation, depending on the surrounding environment and the laser power. It has also been shown that coating of the $SiN_x$ with a conformal layer of $HfO_2$ effectively eliminates etching under illumination, suggesting that the solid-electrolyte interface is required for optically induced $SiN_x$ etching. Next, it has been demonstrated that $SiN_x$ etching rates are affected by the type of salt present in the contacting electrolyte, with chloride being the most effective neutral-pH etch catalyst and hydroxide being a very fast etchant. It has been found that controlled etching under applied bias and laser/voltage feedback drives the dielectric breakdown of nanopores with small diameters (<5 nm) and tunable effective thickness (0.5-8 nm). Supported by observations of asymmetric molecular transport across these nanopores, it is conjectured that the pores are asymmetric in shape, exhibiting a funnel-like geometry. This approach can serve as a foundation for high-resolution pores that are comparable in geometry to protein-based nanopores used in DNA sequencing.

Experiment: Controlled Photothermal Etching of $SiN_x$

Figure 9A:
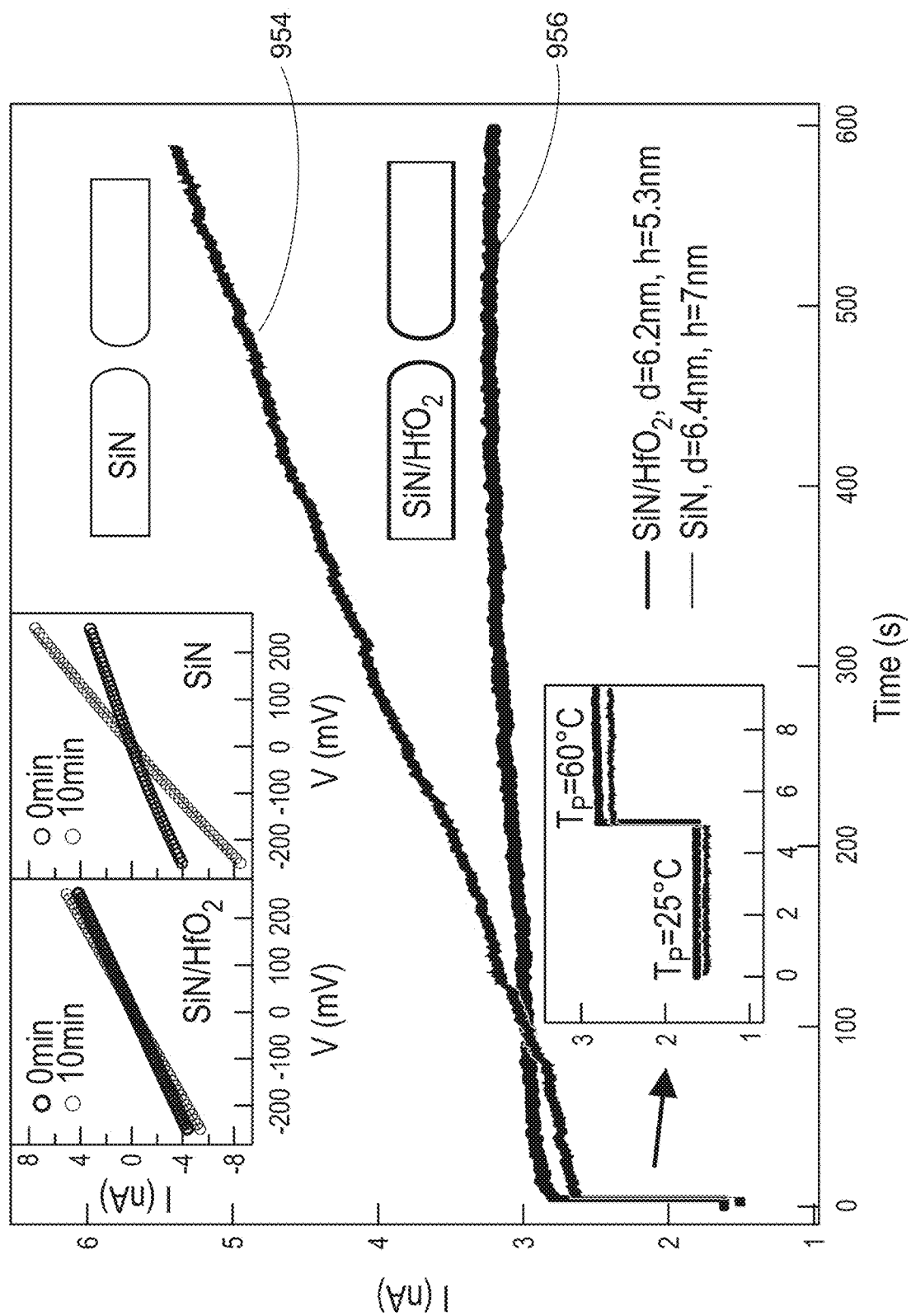
FIGS. 9A-9C are diagrams illustrating controlled photothermal etching, in accordance with an embodiment of the invention.
Figure 9C:
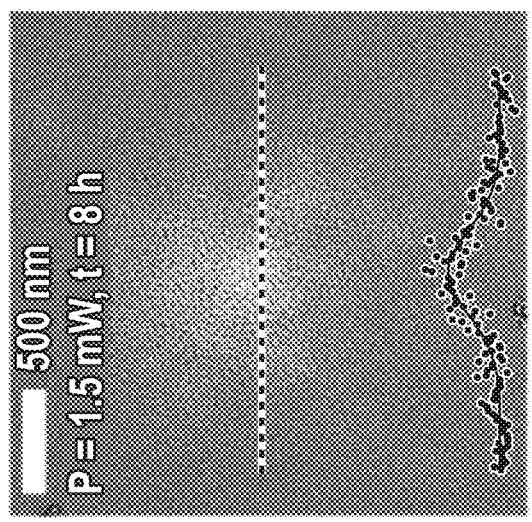
Figure 9B:
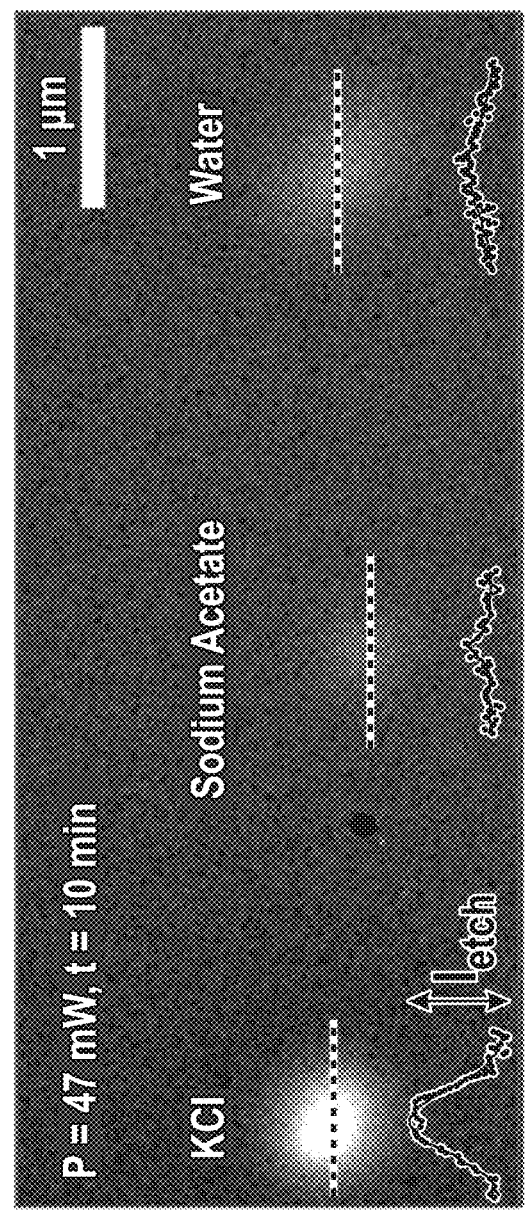

FIGS. 9A-9C are diagrams illustrating controlled photothermal etching, in accordance with an embodiment of the invention.

FIG. 9A is a continuous current trace of a $SiN_x$ and $HfO_2$-coated $SiN_x$ pore at $T_{pore}$=60° C. for 10 min (V=100 mV) under 532 nm laser irradiation (laser turned on after 5 s), in an experiment in accordance with an embodiment of the invention. Line 954: A 6.4 nm diameter $SiN_x$ pore with 7 nm effective thickness. Line 956: A 6.2 nm diameter of $HfO_2$-coated $SiN_x$ pore with 5.3 nm effective thickness. Inset top: I-V curves of $HfO_2$-coated $SiN_x$ and $SiN_x$ pore before and after the 10 min laser illumination. For the $HfO_2$-coated $SiN_x$ pore, before and after conductance values were 17 nS and 20 nS, respectively. For the $SiN_x$ pore, before and after conductance values were 14 nS and 32 nS, respectively. Expanded current traces at 0-9 s, showing laser turn-on times, are shown in the inset.

FIG. 9B is a TEM image of 75 nm-thick $SiN_x$ membrane after 47 mW laser illumination for 10 min in water, 0.4 M sodium acetate, and 0.4 M KCl (T=300° C.), in an experiment in accordance with an embodiment of the invention. Membrane thicknesses at each point are related to the image brightness, and intensity values for the different buffers were 181, 37, and 49 for KCl, sodium acetate, and water, respectively.

FIG. 9C is a TEM image of a 75 nm-thick $SiN_x$ membrane after 1.5 mW laser illumination for 8 h in 4 M KCl, in an experiment in accordance with an embodiment of the invention.

Previous experiments in accordance with an embodiment of the invention found that high temperatures are reached when $SiN_x$ is irradiated using a focused 532 nm laser at high power densities (~$3\times10^7$ W/cm$^2$ at 50 mW laser power, assuming a $1/e^2$ beam diameter of 710 nm). To investigate the impact of the high-energy beam incident upon $SiN_x$ on its integrity, in FIG. 9A there is shown the ion current through a 6.4 nm diameter $SiN_x$ nanopore fabricated using a TEM prior to the experiment (trace 954), when at t=5 s, a 30 mW laser beam has been switched on. The instantaneous jump in ion current (see inset) is due to rapid heating caused by the laser, which results in a peak temperature at the pore of $T_p$=60° C. Pore temperature was calculated using the ion current enhancement profile, as described in our previous report (5). However, following this current jump, we observed a gradual increasing of the ion current, and over a period of 10 min, the pore current approximately doubled. This ion current enhancement is likely due to a combination of $SiN_x$ thinning and pore expansion, since both processes are consistent with stimulated dissolution of the $SiN_x$, as recently observed using a similar-wavelength (488 nm) and similar-intensity laser. (2, 5, 6). When a bare 7.6 nm diameter $SiN_x$ pore surface was passivated with a conformal layer of 1 nm-thick $HfO_2$, a dielectric material, it was found that $HfO_2$ greatly inhibits pore dissolution (trace 956). The current changes for the bare and $HfO_2$-coated $SiN_x$ pores are 5.0 and 0.6 pA/s, respectively. I-V curves of both pores before and after the 10 min laser treatments, shown in the inset, highlight the photoreactivity of bare $SiN_x$.

To gain more insight into the factors that influence the observed $SiN_x$ photothermal reactivity, FIG. 9B shows bright-field TEM images of a membrane which has been irradiated for 10 min at different locations using a 47 mW power ($T_p$=300° C.), where prior to irradiation, the cis and trans fluids were replaced to expose the $SiN_x$ membrane to either 0.4 M KCl, 0.4 M sodium acetate or pure water. Brightness in this TEM image corresponds to a higher transmitted electron dose through the membrane, which means that the $SiN_x$ is thinnest in the case of chloride exposure. Based on these measurements, chloride is a more effective promoter of $SiN_x$ dissolution, whereas in acetate and pure water, $SiN_x$ dissolution is minimal. This series of experiments was repeated with very similar results. Further, FIG. 9C shows the impact of 8 h laser illumination at a power of 1.5 mW in 4 M KCl buffer. The slow etching of $SiN_x$ under a weak laser illumination, in which the photothermal effect is negligible, emphasizes that the etching process is photothermally activated. (3, 4).

Experiment: $SiN_x$ Dissolution Kinetics and Mechanism

Figure 10A:
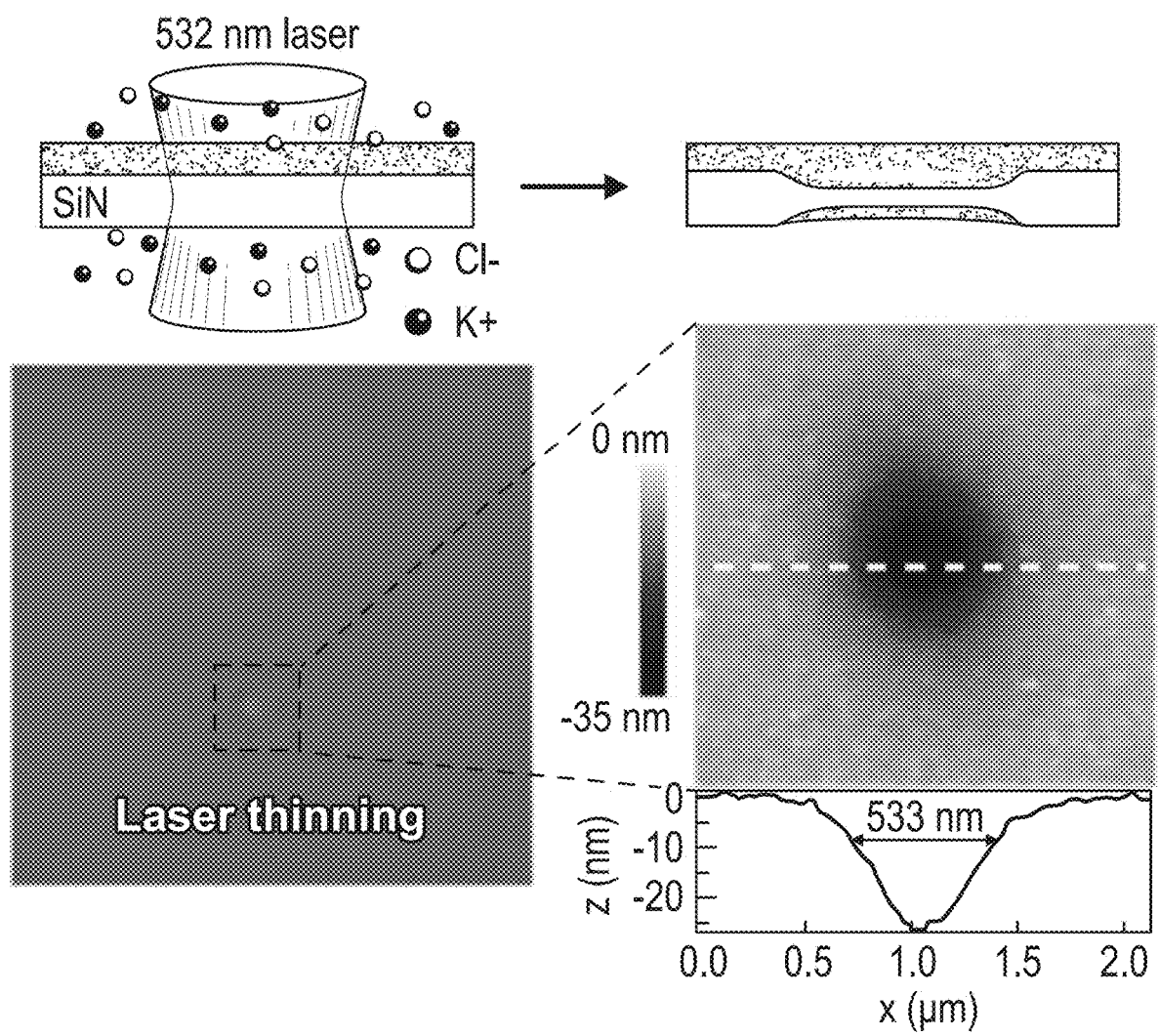
FIG. 10A is a schematic diagram of photochemical etching on freestanding $SiN_x$ membrane, in an experiment in accordance with an embodiment of the invention.

FIG. 10A is a schematic diagram of photochemical etching on freestanding $SiN_x$ membrane, in an experiment in accordance with an embodiment of the invention. When a collimated 532 nm laser was focused on a $SiN_x$ freestanding membrane, locally photochemical etching starts at both sides of the membrane due to its exposure in aqueous chloride solutions. Optical image after photochemical etching with P=47 mW (diameter of light spot: 710 nm) and V=1 V for 3 min in 0.4 M KCl (etch width fwhm: 533 nm, maximum etch depth: 26.2 nm).

Figure 10B:
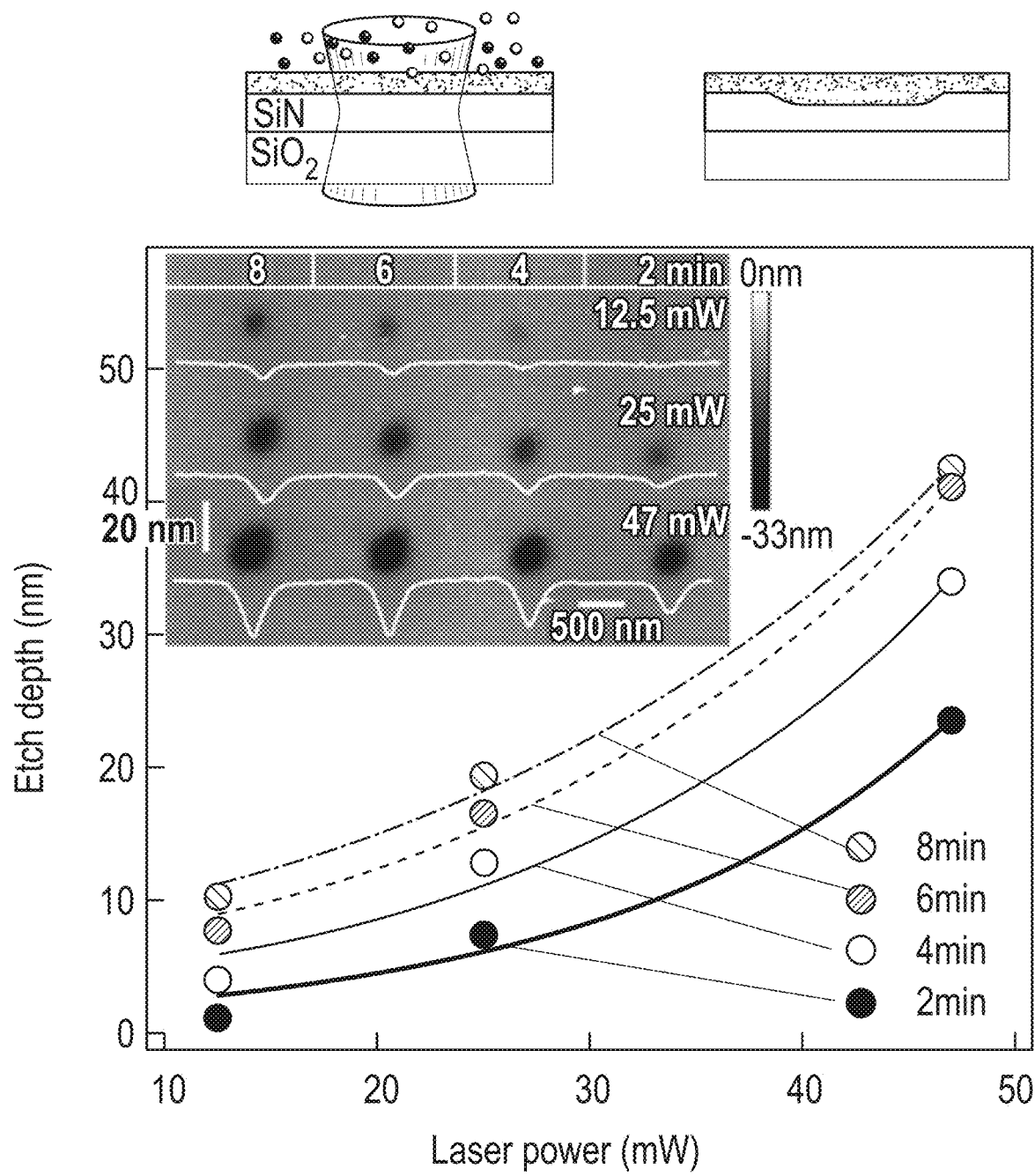
FIG. 10B shows AFM-measured etch depth profiles, laser at different laser powers and times, for 75 nm-thick $SiN_x$ supported by 2.5-μm-thick silicon oxide on silicon, in an experiment in accordance with an embodiment of the invention.

FIG. 10B shows AFM-measured etch depth profiles, laser at different laser powers and times, for 75 nm-thick SiNx supported by 2.5-μm-thick silicon oxide on silicon, in an experiment in accordance with an embodiment of the invention. Inset: AFM image of an etched array at indicated laser powers and times. The distance between each etched point was 3 μm. White lines are depth profiles measured across the center of the etch regions.

FIG. 3 (above) shows a proposed mechanism of photochemical $SiN_x$ etching assisted by chloride ions, in accordance with an embodiment of the invention. When Si-rich regions of $SiN_x$ absorb the laser irradiation, the electron-poor photoactivated Si can attract $Cl^-$ binding, promoting Si—Si bond breaks which lead to eventual oxidation. The resulting amorphous oxide is soluble at high temperatures, leading to thinning of the $SiN_x$ membrane.

Figure 11:
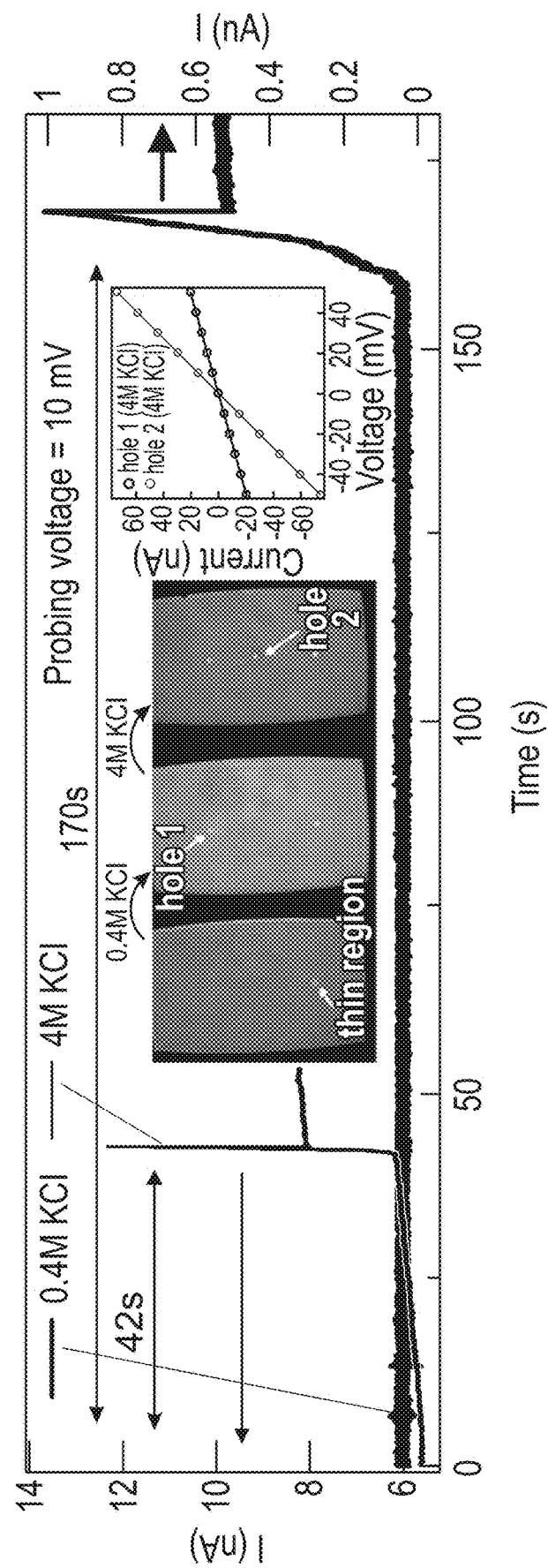
FIG. 11 is a continuous current trace of 75 nm-thick $SiN_x$ membrane etching in 0.4 M KCl and 4 M KCl using a 10 mV probing voltage (laser power was 47 mW), in an experiment in accordance with an embodiment of the invention.

FIG. 11 is a continuous current trace of 75 nm-thick $SiN_x$ membrane etching in 0.4 M KCl and 4 M KCl using a 10 mV probing voltage (laser power was 47 mW), in an experiment in accordance with an embodiment of the invention. When current threshold levels of 1 nA and 12 nA were reached for 0.4 and 4 M KCl, respectively, laser irradiation was shut off. Inset left: Optical images before laser-assisted $SiN_x$ thinning, after first pore at 0.4 M KCl, and after second pore at 4 M KCl, respectively (left-to-right). Inset right: I-V curves after first and second pore formation, both recorded in 4 M KCl.

In more detail, experiments in accordance with an embodiment of the invention studied the dependence of light power and electrolyte strength on $SiN_x$ dissolution kinetics by quantitative measurements using atomic force microscopy (AFM). FIG. 10A shows the impact of a 3 min irradiation on a freestanding 75 nm-thick $SiN_x$ membrane. AFM image of 47 mW laser illumination with V=1 V for 3 min yields Gaussian distributed etch profiles (1) (etch width fwhm: 533 nm, maximum etch depth: 26.2 nm). Notably, this etch profile matches the laser beam profile, as previously probed using nanopore tomography. (7). Further, it was found that the etch rate depends nonlinearly on the laser power, which points to an activated chemical process as suggested by an Arrhenius equation, as shown in FIG. 10B. The combined observations suggest the following mechanism for the observed etching process: when silicon rich $SiN_x$ (x~1) absorbs blue-green light, silicon bonds are activated by charge separation, which can likely lead to destabilization of Si—Si bonds in the Si-rich material. (4). It is hypothesized that $Cl^-$ can stabilize the transiently formed activated Si by forming transient Si—Cl bonds, which can explain $Cl^-$-promoted breakdown of activated Si—Si bonds, as shown in FIG. 3. Noted here is a known process in which chlorine plasma efficiently breaks down $Si_3N_4$: (8)

$$Cl + Si_3N_4 \rightarrow SiCl_4 + NCl_3, N, N_2 \qquad (1)$$

Interestingly, photothermal heating has been shown to accelerate this process, especially at 300-500° C. (9) While the formed Si—Cl bond is unstable in the presence of water, Cr can be rapidly displaced by water molecules leading to oxidation, in accordance with the observed reduction in PL upon irradiation. (2) Dissolution of the resulting amorphous $SiO_2$ product can then be explained by the hot spot induced by the laser, since solubility of amorphous $SiO_2$ is enhanced greatly by temperature. (10) Further evidence of chloride mediated $SiN_x$ etching was obtained when 75 nm $SiN_x$ etching time was compared in 0.4 and 4 M KCl on the same membrane. FIG. 11 shows a current trace of a membrane under a focused 47 mW laser illumination at a low probing voltage of V=10 mV, in which a hole was formed after 170 s when the electrolyte was 0.4 M KCl. In contrast, using 4 M KCl, a hole formed after 42 s, suggesting that an increased $Cl^-$ concentration is accelerating pore formation. Similar experiments using 0.04 M KCl resulted in ~3 times slower hole formation, consistent across three independent experimental sets. Finally, while small pH decreases (1-2 units) do result from heating tris buffer, (11) it is noted that etching was even faster at a higher pH, suggesting that slightly lower pH values cannot be responsible for this etching mechanism (0.1 M KOH).

Experiment: Laser-Assisted Dielectric Breakdown of Nanopores

Figure 12A:
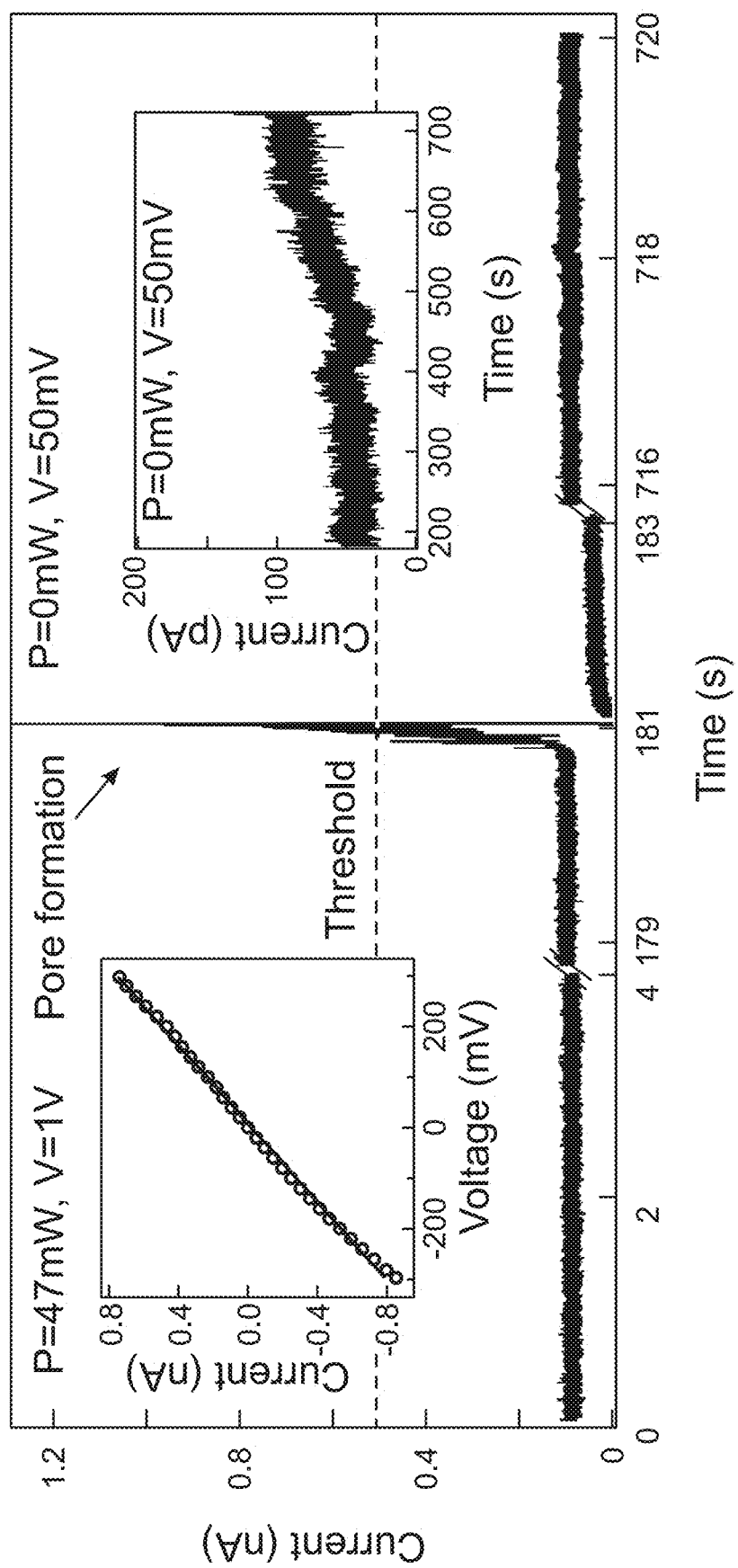
FIGS. 12A and 12B are diagrams illustrating laser-assisted dielectric breakdown for nanopore fabrication, in experiments in accordance with an embodiment of the invention.
Figure 12B:
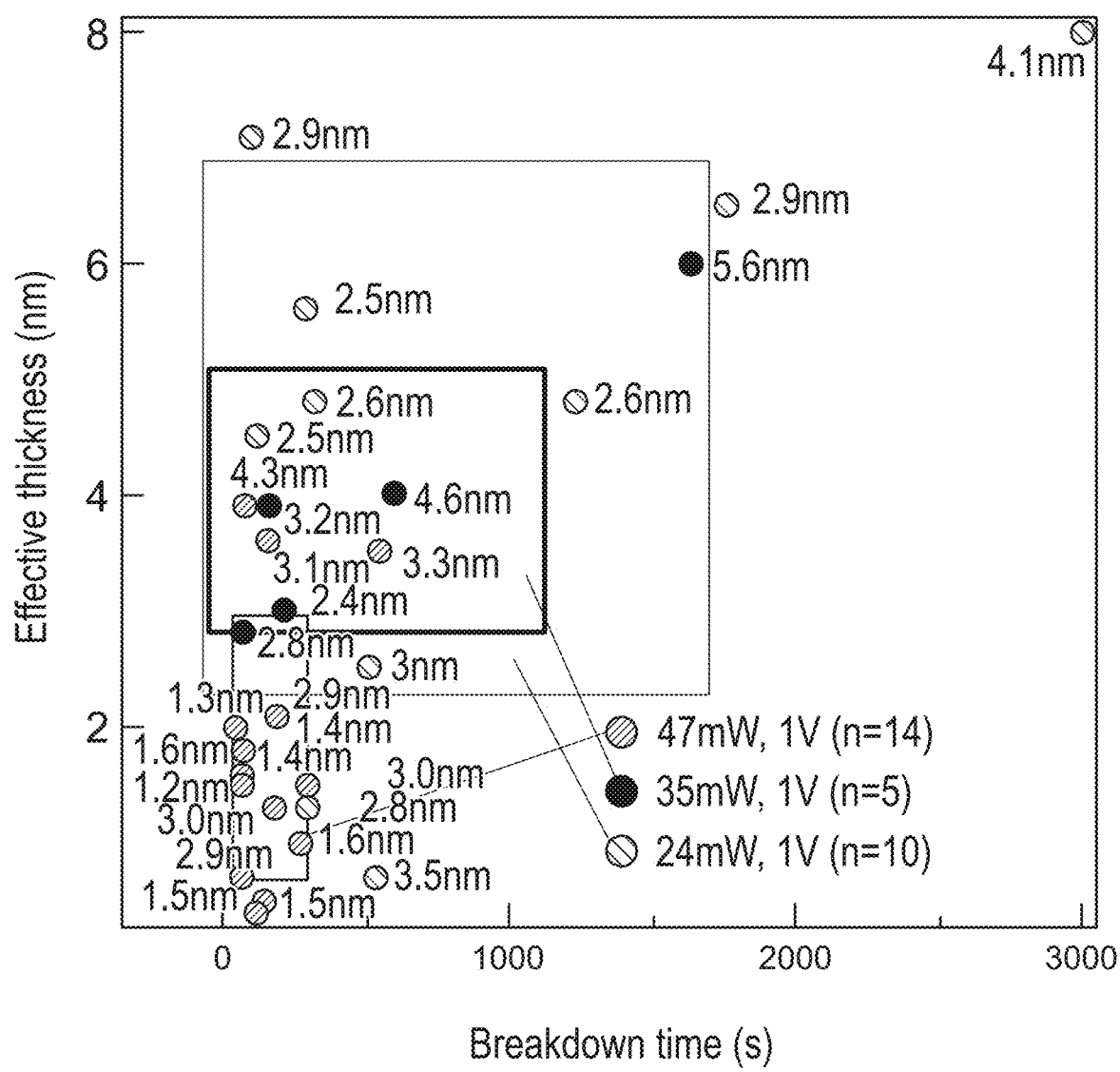

FIGS. 12A and 12B are diagrams illustrating laser-assisted dielectric breakdown for nanopore fabrication, in experiments in accordance with an embodiment of the invention.

FIG. 12A shows a continuous current trace obtained during $SiN_x$ laser assisted dielectric breakdown (35 mW laser power, V=1 V, laser turned on at 0 s), in an experiment in accordance with an embodiment of the invention. When pore formation is indicated by the current reaching 0.5 nA, the software turned off the laser, and a probing voltage of V=50 mV was applied. Inset (left): I-V curve of 2.4 nm diameter pore with 3 nm effective thickness formed using this method. Inset (right): 9 min continuous trace during pore expansion and stabilization at 50 mV probing voltage.

FIG. 12B is a scatter plot of pore thicknesses vs breakdown times for 29 pores with three different laser powers used (P=47 mW shown in red, P=35 mW shown in blue, and P=24 mW shown in green), in an experiment in accordance with an embodiment of the invention. Squares represent one standard deviation the parameters. Average breakdown times were 165±67 s (47 mW), 536±288 s (35 mW), and 814±440 s (24 mW), and average effective respective thicknesses were 1.8±1.1 nm, 3.9±1.1 nm, and 4.6±2.3 nm.

In more detail, it is found that laser-assisted $SiN_x$ etching greatly facilitates the fabrication of ultrathin and ultrasmall nanopores using dielectric breakdown. FIG. 12A shows a continuous current trace during laser-assisted dielectric breakdown (V=1 V applied to the cis chamber, P=47 mW). When the $SiN_x$ membrane is sufficiently thin, breakdown can occur (<8 nm), and pore formation is marked by a sharp current rise, as seen at 180 s in the trace. Using software-based feedback, we stop the high-power laser illumination and reduce the voltage to 50 mV when the ion current reaches our specified threshold current (0.5 nA). After initial pore formation, we apply a weak voltage (50-100 mV) for up to 30 min to allow equilibration and stabilization of the pore current prior to adding biomolecules (see FIG. 12A, inset). Since both laser heating and voltage were used, it is assumed that the dielectric breakdown process includes $SiN_x$ thinning, thermal heating acceleration of defect production, and additional electric field by light. (1, 12-14) Pore size and its effective thickness are calculated using established methods that measure DNA blockades and DNA diameters (2.2 nm for dsDNA and 1.2 nm for ssDNA). (15, 16). Laser induced breakdown allows fabrication of a sub-5 nm diameter pore with thickness values that are well below 5 nm, as indicated by high blockade amplitudes observed for translocations. In FIG. 12B are shown pore thicknesses vs breakdown times and resulting pore diameters obtained using three different laser powers for a total of 29 pores made. The boxes represent one standard deviation in each parameter for the experiments conducted. It is found that weak laser powers produce larger deviations in breakdown times and thicker pores, as compared with high laser powers, for which pores are routinely obtained with ~2 nm average thickness within 1-2 min of processing. The results demonstrate the sophisticated control that laser power and voltage have over the delicate size and shape of nanopores.

Figure 12C:
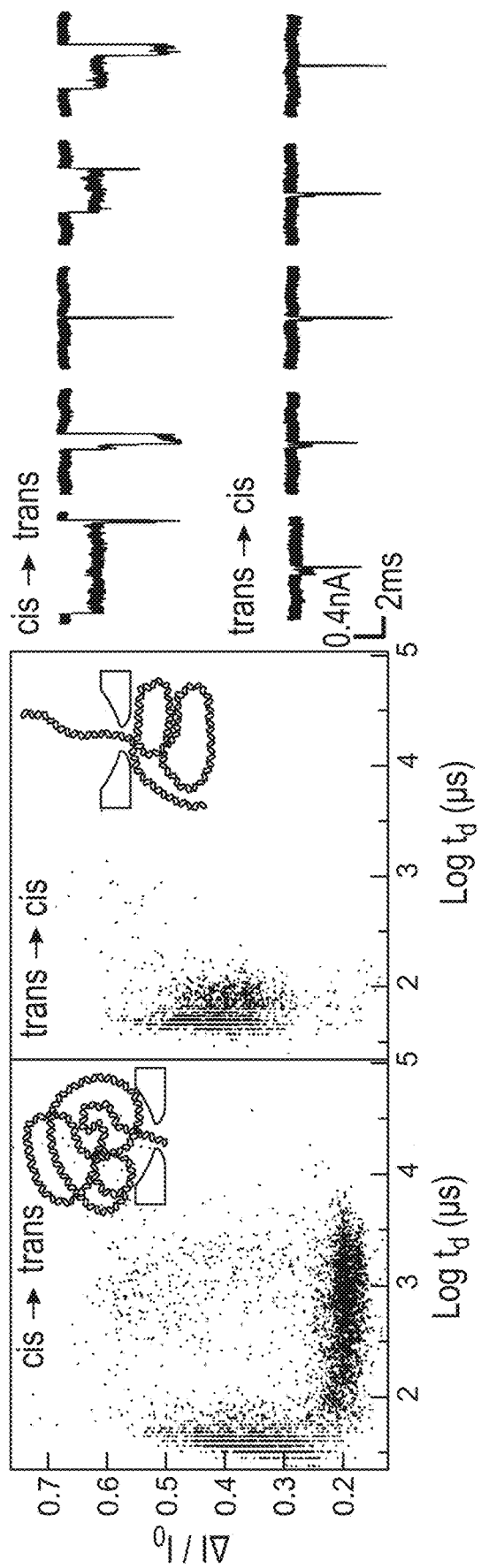
FIG. 12C is a diagram showing typical $\Delta I/I0$ vs log $t_d$ scatter plots obtained for 2.5 kbp DNA translocation dynamics through a 3.3 nm diameter pore with 2.8 nm effective thickness at 300 mV from cis (left) and trans (right) side, in an experiment in accordance with an embodiment of the invention.

Experiment: Evidence for Asymmetric Nanopore Shape in Laser-Assisted Breakdown Pores FIG. 12C is a diagram showing typical $\Delta I/I0$ vs log $t_d$ scatter plots obtained for 2.5 kbp DNA translocation dynamics through a 3.3 nm diameter pore with 2.8 nm effective thickness at 300 mV from cis (left) and trans (right) side, in an experiment in accordance with an embodiment of the invention. Right: concatenated traces of DNA translocation events, low-pass-filtered at 10 kHz. DNA concentrations at cis and trans sides were 6 nM and 4 nM, respectively.

One aspect of these pores fabricated using high laser powers is their shape, which is extremely difficult to image, yet for which DNA translocation data suggests a consistent pattern. In FIG. 12C, there is shown 2.5 kbp DNA translocation dynamics through a pore (d=3.3 nm, $t_{eff}$=2.8 nm) made by the method, as a function of the translocation direction. In the cis-to-trans direction, DNA translocation events have to clear two-blockade levels, a shallow one and a deep one, which corresponds to docking at the pore entrance due to its funnel-like shape, and translocation. Interestingly, this docking time is very long and almost always ends with translocation. In contrast, in the trans-to-cis direction one observes rapid deep events, suggesting that DNA docking times are much faster in this direction. A hypothesized mechanism for this result, which is observed consistently for pores generated using this method, is that the pore shape is asymmetric and funnel-like in shape. As the cartoons illustrate (see insets to FIG. 12C, right), this asymmetric pore structure yields a pocket for DNA that results in longer docking times than when DNA approaches from the narrower opening. Further, different capture rates are found for DNA entering from either side, with rates of $3.19\pm0.08$ s$^{-1}$ nM$^{-1}$ for cis-to-trans direction and $1.05\pm0.03$ s$^{-1}$ nM$^{-1}$ for trans-to-cis direction. Both of these features, namely longer docking times and faster capture rates from cis entry into pore than from trans entry, were previously observed for ssDNA entry into the protein channel α-hemolysin. (17, 18) The asymmetric geometry is also suggested from the corresponding increase of effective thickness as pore size.

Figures 13A, 13B:
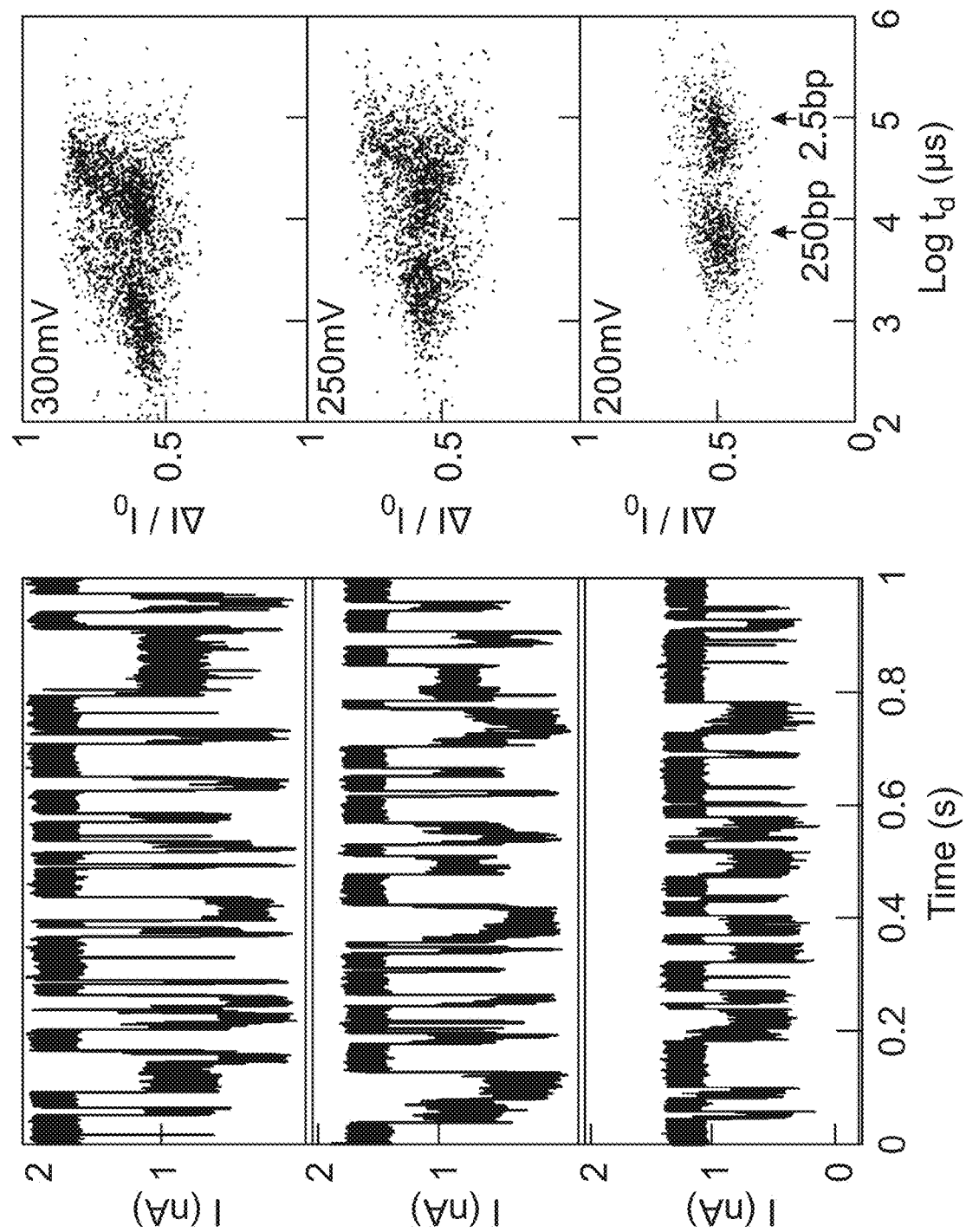
FIGS. 13A and 13B show discrimination of 250 bp and 2.5 kbp DNA, in experiments in accordance with an embodiment of the invention.

Ultrathin nanopores fabricated using laser-assisted dielectric breakdown can be used to differentiate two dsDNA lengths based on their dwell times in a DNA mixture. (19, 20) FIGS. 13A and 13B show discrimination of 250 bp and 2.5 kbp DNA, in experiments in accordance with an embodiment of the invention. FIG. 13A shows continuous 1 s trace excerpts at 200, 250, and 300 mV for a 2.7 nm pore with 1.7 nm effective thickness for a mixture of 250 bp (30 nM) and 2.5 kbp (3 nM) dsDNA added to the cis chamber. Traces were low-pass filtered at 20 kHz. FIG. 13B shows $\Delta I/I0$ vs log $t_d$ of a mixture of 250 bp and 2.5 kbp at 200, 250, and 300 mV, showing an optimal resolution between the two lengths at 300 mV.

In more detail, FIG. 13A shows continuous current traces for a mixture of 250 bp (30 nM) and 2.5 kbp (3 nM) translocating through an ultrathin pore (d=2.7 nm, $t_{eff}$=1.7 nm) at 200, 250, and 300 mV. Scatter plots of $\Delta I/I0$ vs log $t_d$, shown in FIG. 13B, reveal mean log $t_d$ values for 250 bp/2.5 kbp of $3.80\pm0.01/4.79\pm0.01$, $3.36\pm0.03/4.47\pm0.02$, and $3.19\pm0.05/4.29\pm0.02$ µs for 200, 250, and 300 mV, respectively. In this experiment, expansion of the pore was minimal despite the ultrathin SiN$_x$ membrane. Also, it is found that as voltage increases, the 2.5 kbp dsDNA produces larger fractional blockades (but not the 250 bp DNA), attributed to interactions of the longer DNA coil with significant electric fields outside the pore. (20) It is noted that the long docking times observed with the larger 3.3 nm diameter pore in FIG. 12 was not observed in this experiment, because the pore diameter is significantly smaller, which yields an electric field outside the pore that is too weak to trap DNA in the pore mouth.

Experiment: DNA Homopolymer Differentiation Using Sub-2 nm-Thick Pores

FIGS. 14A-14D are diagrams showing current discrimination of dC and dA homopolymers using an ultrathin laser-assisted breakdown pore, in experiments in accordance with an embodiment of the invention.

Figure 14A:
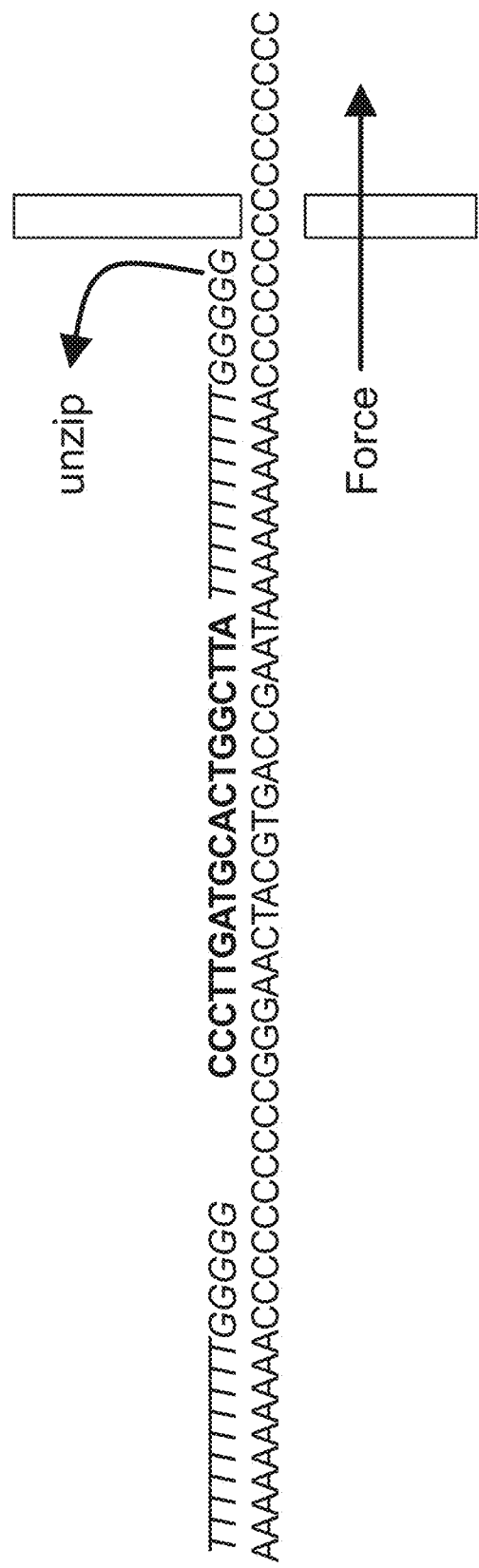
FIGS. 14A-14D are diagrams showing current discrimination of dC and dA homopolymers using an ultrathin laser-assisted breakdown pore, in experiments in accordance with an embodiment of the invention.

FIG. 14A is a schematic diagram of sequentially unzipping dsDNA to expose a predetermined temporal sequence of homopolymers to the pore, in an experiment in accordance with an embodiment of the invention. During unzipping DNA duplex, either a poly(dC) or a poly(dA) portion of the ssDNA template resides inside the pore, allowing residual ion currents to be probed. Designed DNA is in the probing order of poly(dC), poly(dA), and poly(dC).

Figure 14B:
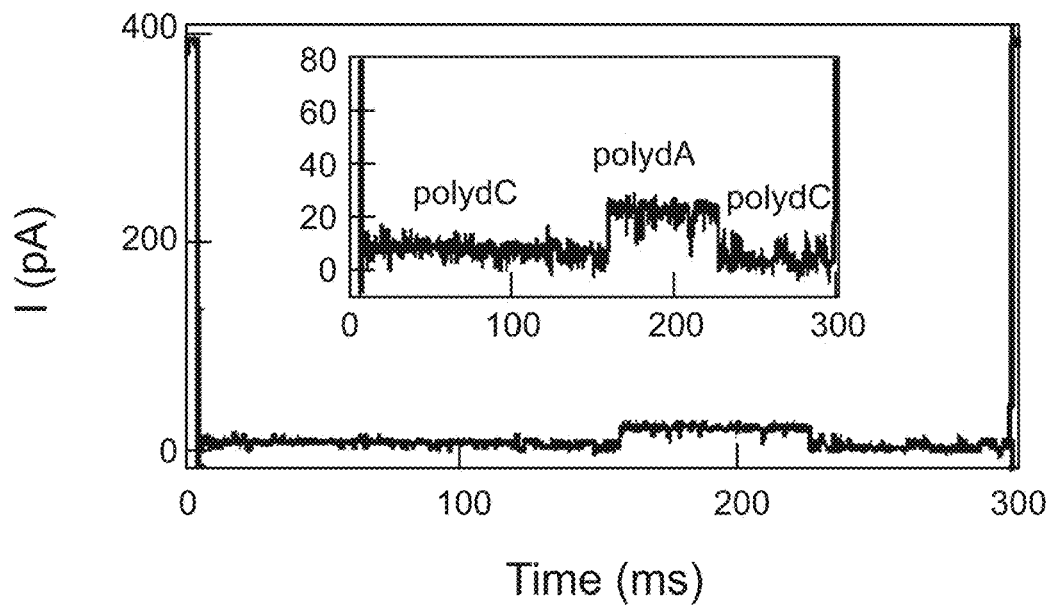

FIG. 14B is a current trace of DNA unzipping in a 1.4 nm diameter pore with 1.8 nm effective thickness at 200 mV (trace was low-pass-filtered at 1 kHz), in an experiment in accordance with an embodiment of the invention. The expanded trace with poly(dC) and poly(dA) labels is shown in the inset.

Figure 14C:
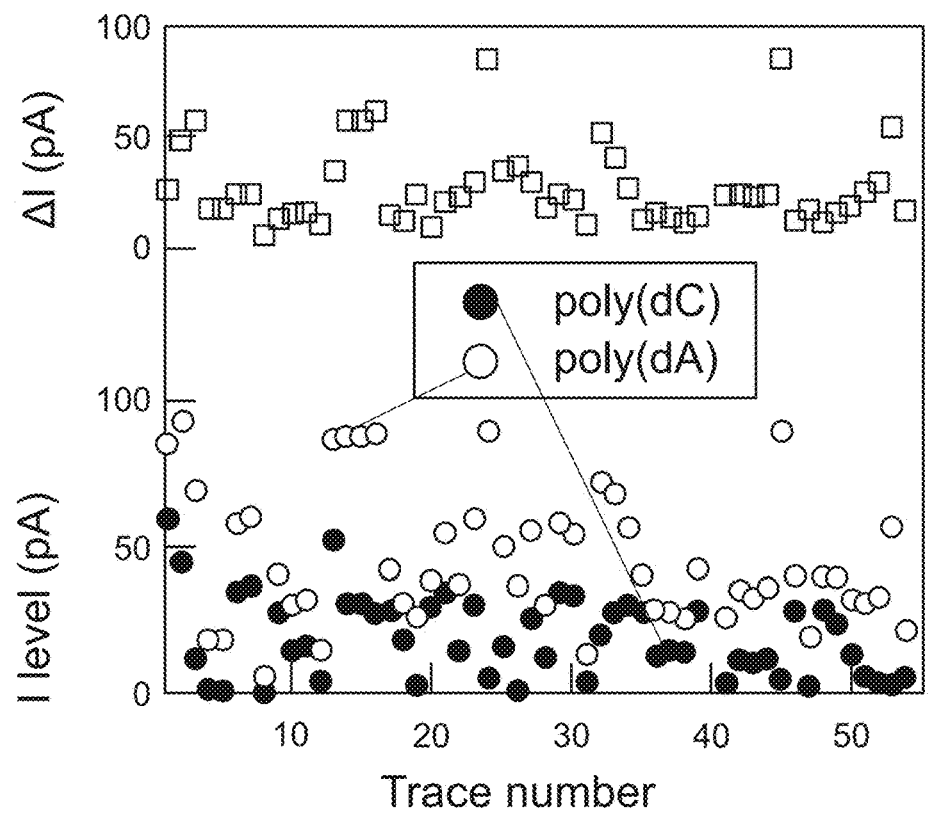

FIG. 14C shows I levels of poly(dC) (blue markers) and poly(dA) (red markers) and $\Delta I$ dA-dC (black squares), in an experiment in accordance with an embodiment of the invention. Current levels were obtained by double Gaussian fits to the current histograms of each event.

Figure 14D:
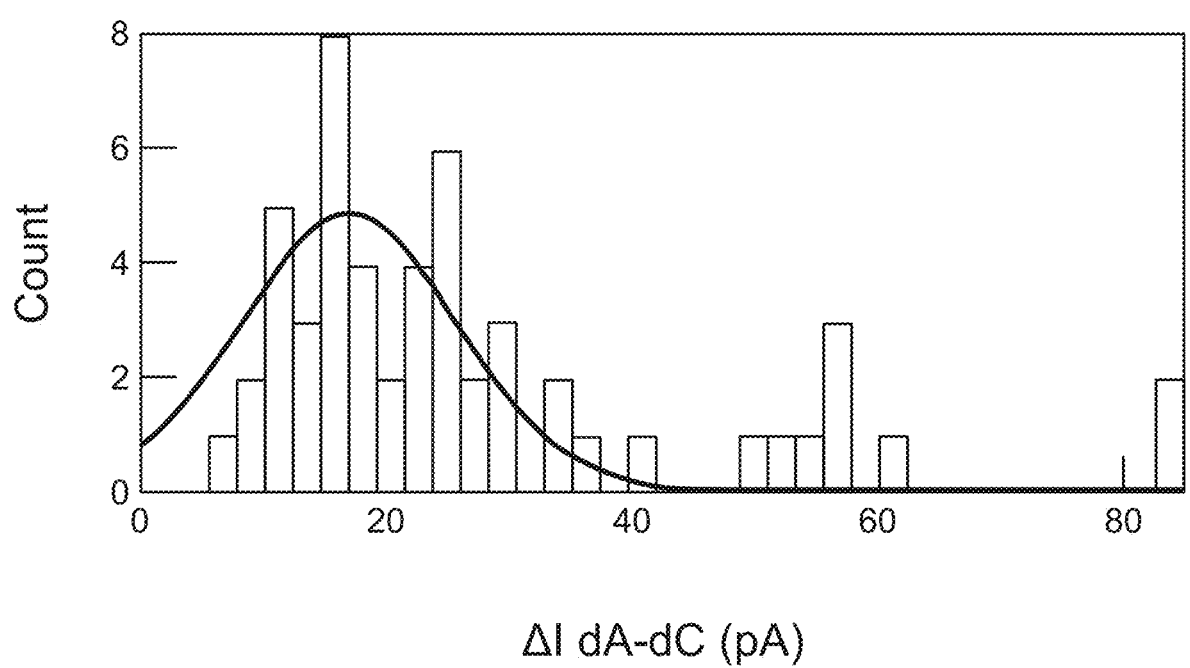

FIG. 14D is a histogram of differential $\Delta I$ dA-dC with the Gaussian fit, in an experiment in accordance with an embodiment of the invention. Mean $\Delta I$ current difference between dA and dC levels was $16.9\pm1.4$ pA.

In more detail, in FIGS. 14A-14D, there are shown the results of experiments involving DNA homopolymer differentiation using sub-2 nm thick pores. These experiments demonstrate the ability of an ultrathin sub-2 nm diameter pore (d=1.4 nm, $t_{eff}$=1.8 nm) to discriminate among two homopolymer types. FIG. 14A schematically illustrates a vertically oriented membrane where a long template DNA (61-nucleotide) is inserted into the pore, and hybridized DNA oligomers (15 and 19 nucleotides) are sequentially unzipped by voltage-induced force applied to the DNA template. In this experiment, the current levels of poly(dA) and poly(dC) that are in the pore during the three-stage unzipping process are probed. Under an applied voltage (200 mV), the poly(dC) tail of the template DNA enters the pore and resides there until the first duplex unzips, then the poly(dA) resides in the pore, and finally the poly(dC) resides in the pore. It was found that events longer than 5 ms comprised 3.36% of the total events for the single-stranded 61-nucleotide DNA template, whereas for the hybridized sample, 20.3% of the events lasted longer than 5 ms, which is attributed to unzipping events. (21) Within this long event population, in 18.6% of the events, there were observed two distinct blockade levels, which are ascribed to the helix structure of poly(dC) and poly(dA) (FIG. 14B). As with α-hemolysin experiments, the 1.3 nm-wide poly(C) helical secondary structure can be accommodated in 1.4 nm pore, while the 2.1 nm-wide poly(A) helix is too large to fit inside the narrow pore, (22) resulting in a shallower blockade current for poly(dA).

FIG. 14C shows current blockade levels of poly(dC) and poly(dA) and its difference from the same pore. The mean $\Delta I$ difference between dA and dC (FIG. 14D) in all these events is 16.9±1.4 pA, in good agreement with previous α-hemolysin and MspA experiments. (22-24) Although nucleotide resolution using a solid-state nanopore was previously demonstrated by homopolymer discrimination, (25-27) these results show that ultrathin solid-state nanopores have the sensitivity to discriminate both types of polymers within a single molecular chain.

REFERENCES (1) Pud, S.; Verschueren, D.; Vukovic, N.; Plesa, C.; Jonsson, M. P.; Dekker, C. Self-Aligned Plasmonic Nanopores by Optically Controlled Dielectric Breakdown. *Nano Lett.* 2015, 15, 7112-7117.

(2) Gilboa, T.; Zrehen, A.; Girsault, A.; Meller, A. Optically-Monitored Nanopore Fabrication Using a Focused Laser Beam. *Sci. Rep.* 2018, 8, 9765.

(3) Deshpande, S. V.; Gulari, E.; Brown, S. W.; Rand, S. C. Optical Properties of Silicon Nitride Films Deposited by Hot Filament Chemical Vapor Deposition. *J. Appl. Phys.* 1995, 77, 6534-6541.

(4) Giorgis, F.; Vinegoni, C.; Pavesi, L. Optical Absorption and Photoluminescence Properties of a-Si1-xNx: H Films Deposited by Plasma-enhanced CVD. *Phys. Rev. B: Condens. Matter Mater. Phys.* 2000, 61, 4693-4698.

(5) Yamazaki, H.; Hu, R.; Henley, R. Y.; Halman, J.; Afonin, K. A.; Yu, D.; Zhao, Q.; Wanunu, M. Label-Free Single-Molecule Thermoscopy Using a Laser-Heated Nanopore. *Nano Lett.* 2017, 17, 7067-7074.

(6) Nicoli, F.; Verschueren, D.; Klein, M.; Dekker, C.; Jonsson, M. P. DNA Translocations through Solid-State Plasmonic Nanopores. *Nano Lett.* 2014, 14, 6917-6925.

(7) Keyser, U. F.; Krapf, D.; Koeleman, B. N.; Smeets, R. M. M.; Dekker, N. H.; Dekker, C. Nanopore Tomography of a Laser Focus. *Nano Lett.* 2005, 5, 2253-2256.

(8) Pant, B. D.; Tandon, U. S. Etching of Silicon Nitride in CCl2F2, CHF3, SiF4, and SF6 Reactive Plasma: A Comparative Study. Plasma Chem. *Plasma Process.* 1999, 19, 545-563.

(9) Staffa, J.; Hwang, D.; Luther, B.; Ruzyllo, J.; Grant, R. Temperature Dependence of the Etch Rate and Selectivity of Silicon Nitride over Silicon Dioxide in Remote Plasma NF$_3$/Cl$_2$. *Appl. Phys. Lett.* 1995, 67, 1902-1904.

(10) Fournier, R. O.; Rowe, J. J. The Solubility of Amorphous Silica at High Temperatures and High Pressures. *Am. Mineral.* 1977, 62, 1052-1056.

(11) Reineke, K.; Mathys, A.; Knorr, D. Shift of pH-Value During Thermal Treatments in Buffer Solutions and Selected Foods. *Int. J. Food Prop.* 2011, 14, 870-881.

(12) Rothemund, W.; Fritzsche, C. R. Dielectric Breakdown of Reactively Sputtered Silicon Nitride. *Thin Solid Films* 1973, 15, 199-205.

(13) Lombardo, S.; Stathis, J. H.; Linder, B. P.; Pey, K. L.; Palumbo, F.; Tung, C. H. Dielectric Breakdown Mechanisms in Gate Oxides. *J. Appl. Phys.* 2005, 98, 121301.

(14) McPherson, J. W.; Mogul, H. C. Underlying Physics of the Thermochemical E Model in Describing Low-field Time-dependent Dielectric Breakdown in SiO$_2$ Thin Films. *J. Appl. Phys.* 1998, 84, 1513-1523.

(15) Wanunu, M.; Dadosh, T.; Ray, V.; Jin, J.; McReynolds, L.; Drndić, M. Rapid Electronic Detection of Probe-specific microRNAs using Thin Nanopore Sensors. *Nat. Nanotechnol.* 2010, 5, 807.

(16) Kowalczyk, S. W.; Grosberg, A. Y.; Rabin, Y.; Dekker, C. Modeling the Conductance and DNA Blockade of Solid-state Nanopores. *Nanotechnology* 2011, 22, 315101.

(17) Henrickson, S. E.; Misakian, M.; Robertson, B.; Kasianowicz, J. J. Driven DNA Transport into an Asymmetric Nanometer-Scale Pore. *Phys. Rev. Lett.* 2000, 85, 3057-3060.

(18) Bell, N. A. W.; Chen, K.; Ghosal, S.; Ricci, M.; Keyser, U. F. Asymmetric Dynamics of DNA Entering and Exiting a Strongly Confining Nanopore. *Nat. Commun.* 2017, 8, 380.

(19) Fologea, D.; Brandin, E.; Uplinger, J.; Branton, D.; Li, J. DNA Conformation and Base Number Simultaneously Determined in a Nanopore. *Electrophoresis* 2007, 28, 3186-3192.

(20) Carson, S.; Wilson, J.; Aksimentiev, A.; Wanunu, M. Smooth DNA Transport through a Narrowed Pore Geometry. *Biophys. J.* 2014, 107, 2381-2393.

(21) Lin, Y.; Shi, X.; Liu, S.-C.; Ying, Y.-L.; Li, Q.; Gao, R.; Fathi, F.; Long, Y.-T.; Tian, H. Characterization of DNA Dduplex Unzipping through a Sub-2 nm Solid-state Nanopore. *Chem. Commun.* 2017, 53, 3539-3542.

(22) Akeson, M.; Branton, D.; Kasianowicz, J. J.; Brandin, E.; Deamer, D. W. Microsecond Time-Scale Discrimination Among Polycytidylic Acid, Polyadenylic Acid, and Polyuridylic Acid as Homopolymers or as Segments Within Single RNA Molecules. *Biophys. J.* 1999, 77, 3227-3233.

(23) Derrington, I. M.; Butler, T. Z.; Collins, M. D.; Manrao, E.; Pavlenok, M.; Niederweis, M.; Gundlach, J. H. Nanopore DNA Sequencing with MspA. *Proc. Natl. Acad. Sci. U.S.A.* 2010, 107, 16060-16065.

(24) Meller, A.; Nivon, L.; Brandin, E.; Golovchenko, J.; Branton, D. Rapid Nanopore Discrimination between Single Polynucleotide Molecules. *Proc. Natl. Acad. Sci. U.S.A.* 2000, 97, 1079-1084.

(25) Venta, K.; Shemer, G.; Puster, M.; Rodriguez-Manzo, J. A.; Balan, A.; Rosenstein, J. K.; Shepard, K.; Drndić, M. Differentiation of Short, Single-Stranded DNA Homopolymers in Solid-State Nanopores. *ACS Nano* 2013, 7, 4629-4636.

(26) Akahori, R.; Yanagi, I.; Goto, Y.; Harada, K.; Yokoi, T.; Takeda, K.-i. Discrimination of Three Types of Homopolymers in Singlestranded DNA with Solid-state Nanopores through External Control of the DNA Motion. *Sci. Rep.* 2017, 7, 9073.

(27) Lee, M.-H.; Kumar, A.; Park, K.-B.; Cho, S.-Y.; Kim, H.-M.; Lim, M.-C.; Kim, Y.-R.; Kim, K.-B. A Low-Noise Solid-State Nanopore Platform Based on a Highly Insulating Substrate. *Sci. Rep.* 2015, 4, 7448.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A method for etching a light absorbing material, the method comprising:
   contacting the light absorbing material with a solvent comprising an electron donor species; and
   exposing an interface between the solvent and the light absorbing material to light having a wavelength within an absorption band of a light absorbance spectrum of the light absorbing material to induce etching of the light absorbing material, at the interface, by the light and the electron donor species to create an etched feature of less than 1 micron in size, the light having a wavelength between 10 nm and 700 nm and having an average power density of between $10^5$ watts per square centimeter and $10^8$ watts per square centimeter.

2. The method of claim 1, comprising exposing the interface between the solvent and the light absorbing material to the light in the absence of a lithographic mask.

3. The method of claim 1, further comprising forming the etched feature underneath a surface of a structure of which the light absorbing material forms at least a portion.

4. The method of claim 1, further comprising controlling a thickness of the etched feature using feedback from an optical measurement of the etched feature.

5. The method of claim 1, wherein the solvent is biocompatible, and further comprising performing the etching in a biocompatible environment.

6. The method of claim 1, further comprising using the etching to polish a surface of the light absorbing material.

7. The method of claim 1, comprising directly controlling a location of the etched feature on the light absorbing material based on a location of the light on the light absorbing material.

8. The method of claim 1, wherein the electron donor species comprises at least one of: a halogen ion and a hydroxide ion.

9. The method of claim 8, wherein the electron donor species comprises a chloride ion.

10. The method of claim 1, further comprising performing a three-dimensional, layer by layer etching of the light absorbing material.

11. The method of claim 10, further comprising using a light image projection device to provide the light, to perform the three-dimensional, layer by layer etching, based on an electrical signal comprising a three-dimensional etching pattern having features with dimensions less than 1 micron in size.

12. The method of claim 1, further comprising reflecting a beam of the light from a spatial light modulator onto the light absorbing material.

13. The method of claim 12, wherein the reflecting the beam of the light from the spatial light modulator onto the light absorbing material comprises reflecting the beam of the light from a digital micromirror device onto the light absorbing material.

14. The method of claim 1, wherein the light absorbing material comprises silicon.

15. The method of claim 14, wherein the light absorbing material comprises at least one of a silicon-containing nitride and a silicon-containing carbide.

16. The method of claim 15, wherein the light absorbing material comprises a chemical formula $SiN_x$, where x is greater than or equal to 0 and less than or equal to 2.

17. The method of claim 15, wherein the electron donor species comprises at least one of: a halogen ion and a hydroxide ion.

18. The method of claim 1, wherein the etching comprises forming a nanopore through the light absorbing material, the nanopore having a diameter greater than about 1 nanometer and less than about 1 micron.

19. The method of claim 18, wherein the light absorbing material comprises a thickness less than about 1 micron at the location of the nanopore.

20. The method of claim 18, wherein the etched feature defines a nanopore having a greater diameter on one side of the light absorbing material than on an opposite side of the light absorbing material.

21. The method of claim 18, further comprising using the etching to form an array of a plurality of nanopores.

22. The method of claim 18, further comprising assisting the etching by applying a voltage across the light absorbing material to promote dielectric breakdown of the light absorbing material.

23. The method of claim 18, wherein forming the nanopore comprises limiting a power density of the light after a current measured through the light absorbing material increases above a current threshold during the etching.

24. The method of claim 23, comprising limiting the current threshold to determine a size of the nanopore formed by the etching.

* * * * *